United States Patent
Hayashida et al.

(10) Patent No.: US 8,361,223 B2
(45) Date of Patent: Jan. 29, 2013

(54) METHOD FOR MEASURING LIQUID LEVEL IN SINGLE CRYSTAL PULLING APPARATUS EMPLOYING CZ METHOD

(75) Inventors: Toshio Hayashida, Omura (JP); Ayumi Kihara, Omura (JP); Takuaki Takami, Omura (JP)

(73) Assignee: Sumco Techxiv Corporation, Omura-shi (JP)

( * ) Notice: Subject to any disclaimer, the term of this patent is extended or adjusted under 35 U.S.C. 154(b) by 394 days.

(21) Appl. No.: 12/671,983

(22) PCT Filed: Jul. 18, 2008

(86) PCT No.: PCT/JP2008/063001
§ 371 (c)(1),
(2), (4) Date: Feb. 3, 2010

(87) PCT Pub. No.: WO2009/028273
PCT Pub. Date: Mar. 5, 2009

(65) Prior Publication Data
US 2011/0114010 A1    May 19, 2011

(30) Foreign Application Priority Data
Aug. 24, 2007 (JP) ................................. 2007-218409

(51) Int. Cl.
*C30B 15/20* (2006.01)
(52) U.S. Cl. ............... 117/15; 117/11; 117/13; 117/14; 117/30; 117/32; 117/33; 117/34; 117/35; 117/200; 117/201; 117/202; 117/203; 117/206; 117/208; 117/217; 117/218

(58) Field of Classification Search ........... 117/11, 117/13–15, 30, 32–35, 200–203, 206, 208, 117/217–218, 931–932
See application file for complete search history.

(56) References Cited

U.S. PATENT DOCUMENTS

| | | | |
|---|---|---|---|
| 6,572,699 B1 * | 6/2003 | Moriya et al. ................. | 117/15 |
| 6,994,748 B2 * | 2/2006 | Moriya et al. ................. | 117/14 |
| 8,130,386 B1 * | 3/2012 | Hayashida et al. ........... | 356/623 |
| 2001/0054376 A1 * | 12/2001 | Miura et al. .................... | 117/13 |

FOREIGN PATENT DOCUMENTS

| | | |
|---|---|---|
| JP | 2-102187 | 4/1990 |
| JP | 2000-264779 | 9/2000 |

(Continued)

OTHER PUBLICATIONS

International Search Report for International Application No. PCT/JP2008/063001 dated Sep. 9, 2008.

*Primary Examiner* — Michael Kornakov
*Assistant Examiner* — Kenneth A Bratland, Jr.
(74) *Attorney, Agent, or Firm* — Kratz, Quintos & Hanson, LLP

(57) ABSTRACT

Provided is a method for reliably and easily measuring a liquid level by selecting an optimal reflection method from among a plurality of reflection methods, depending on growing conditions of a pulled single crystal. The method comprises: setting a plurality of measuring methods having different ways of determining the liquid level; creating, in advance, information that associates with a gap between the outer peripheral face of the single crystal and a predetermined position located between a heat shield and the outer peripheral face of the single crystal; determining the gap in accordance with manufacturing conditions; selecting a measuring method associated to the determined gap, on the basis of the information; and measuring the liquid level of a melt surface in use of the selected measuring method.

4 Claims, 17 Drawing Sheets

FOREIGN PATENT DOCUMENTS

| | | |
|---|---|---|
| JP | 2005-187291 A1 | 7/2005 |
| JP | 2007-223879 A1 | 9/2007 |
| WO | WO 01/83859 A1 | 11/2001 |
| WO | WO 2007097071 A1 * | 8/2007 |

* cited by examiner

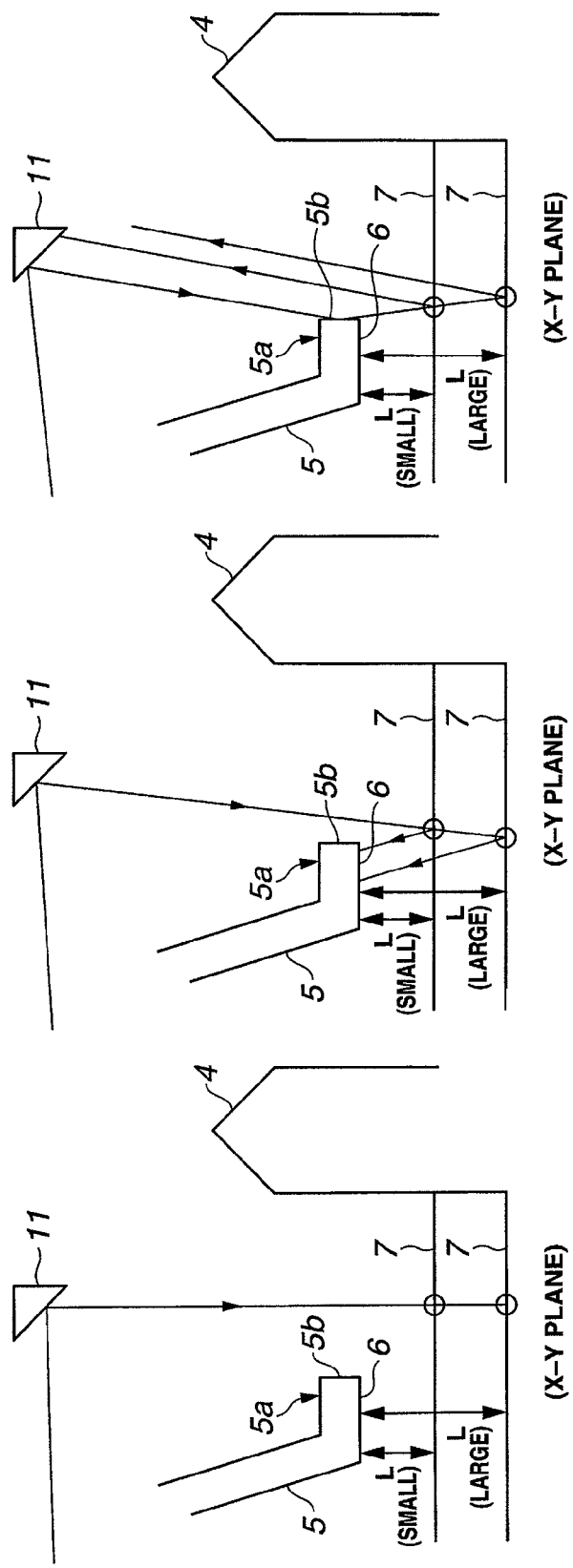

| CONDITIONS | SIDE-FACE REFLECTION METHOD | DIRECT REFLECTION METHOD | RETURN REFLECTION METHOD |
|---|---|---|---|
| (CONDITION 1) GAP D LARGE, GAP L INTERMEDIATE | ○ | □ | ------- |
| (CONDITION 2) GAP D INTERMEDIATE, GAP L LARGE | □ | × | △ |
| (CONDITION 3) GAP D SMALL, GAP L LARGE | △ | × | △ |
| (CONDITION 4) GAP D SMALL, GAP L SMALL | △ | × | × |

(BEAM RECEPTION PROBABILITY) □ ○ △ ×

FIG.9

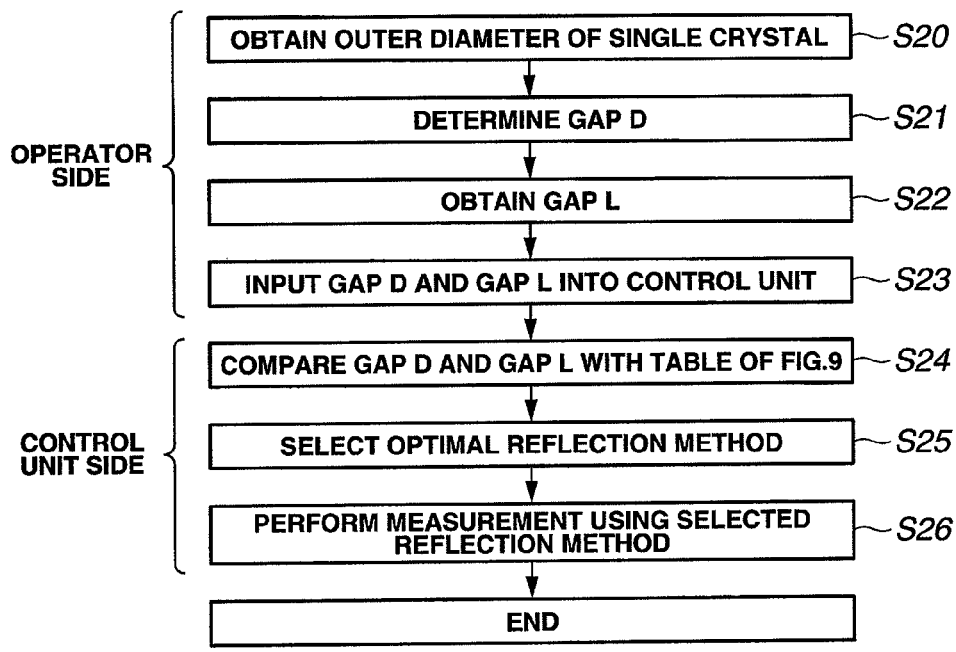

FIG.10

| MAGNETIC FIELD CONDITION | SIDE-FACE REFLECTION METHOD | DIRECT REFLECTION METHOD | RETURN REFLECTION METHOD |
|---|---|---|---|
| MAGNETIC FIELD PRESENT | □ | □ | △ |
| MAGNETIC FIELD ABSENT | ○ | □ | × |

(BEAM RECEPTION PROBABILITY) □ ○ △ ×

FIG.11

A-A CROSS SECTION

FRONT-VIEW DIAGRAM
(X-Z PLANE)

SIDE-VIEW DIAGRAM
(X-Y PLANE)

SIDE-VIEW DIAGRAM (X-Y PLANE)

FRONT-VIEW DIAGRAM (X-Z PLANE)

METHOD FOR MEASURING LIQUID LEVEL IN SINGLE CRYSTAL PULLING APPARATUS EMPLOYING CZ METHOD

TECHNICAL FIELD

The present invention relates to a position measuring method based on the principle of triangulation, and more particularly, to a method for measuring liquid level in a raw material melt liquid in a single crystal pulling apparatus employing a Czochralski method.

BACKGROUND AND SUMMARY OF THE INVENTION

The Czochralski method (CZ method) involves pulling up a growing single crystal ingot from a raw material melt, for instance of silicon, in a crucible. In order to appropriately control the growth of the single crystal, the liquid level (hereafter, melt level) of the raw material melt must be accurately measured, and the position thereof must be adjusted according to the growth of the single crystal.

In particular, silicon single crystal pulling apparatuses (CZ furnaces) using the CZ method are ordinarily provided with a heat shield for controlling the heat radiation from a heater and the silicon melt, and for straightening the flow of gas infused into the CZ furnace.

The thermal history and the impurity concentration (for instance, oxygen concentration) in the pulled single crystal can be kept constant by controlling the relative position (i.e. the distance) between the lower face of the heat shield and the melt level.

Various conventional melt level measuring methods have been proposed to this end. The method for measuring melt level of the invention of the present application employs reflection beams. Except where misunderstanding might arise, the measuring method will be referred to as "reflection method."

Japanese Patent Application Laid-open No. 2000-264779 a method for measuring melt level by triangulation, wherein the melt surface in the crucible is regarded as a direct reflection body. This measuring method will be referred to hereafter as "direct reflection method."

FIG. 18 is a diagram for explaining the trajectory of a laser beam in a direct reflection method. FIG. 18A is a schematic diagram of the trajectory of a laser beam as viewed laterally (X-Y plane). FIG. 18B is a schematic diagram of the trajectory of a laser beam as viewed from the front (X-Z plane). In FIG. 18A, the laser beam is guided by a rotating mirror 9 and a prism 11. In FIG. 18B, the rotating mirror 9 and the prism 11 are omitted, since the trajectory of the laser beam in the Y-axis direction is perpendicular to the paper. To simplify the explanation, portions not essential to triangulation will be omitted.

In FIGS. 18A and 18B, a silicon raw material 3 is melted inside a crucible 2 provided in a CZ furnace 1. A silicon single crystal 4 is pulled up and grown, while rotating toward the upper portion of the figure. A heat shield 5 is disposed outside the silicon single crystal 4. Herein, D denotes the gap between the peripheral wall of the silicon single crystal 4 and the inner peripheral face (side face 5b) of a rim 5a provided at the lower end of the heat shield 5, while L denotes the gap between a melt surface 7 and a lower face 6 of the rim 5a provided at the lower end of the heat shield 5.

In the above invention, a range-finding unit 8 working on the principle of triangulation is used for measuring the melt level of the melt surface 7.

In FIG. 18B, the range-finding unit 8 has provided therein a laser beam source 12 that projects a laser beam and a photodetector 13 that receives a reflected return beam. A lens 13a that condenses the incident laser beam and a linear CCD sensor 13b that detects the condensed laser beam are provided in the photodetector 13.

The laser beam emitted by the range-finding unit 8 is reflected on the rotating mirror 9, passes through an entrance window 10 and a prism 11 disposed in the CZ furnace 1, and strikes the melt surface 7.

The projection position of the laser beam on the melt surface 7 is scanned in the radial direction of the crucible 3 (arrow S2 in the figure) through left-right rotation of the rotating mirror 9 (arrow S1 in the figure). As a result, a return beam reflected on the melt surface 7 passes through the prism 11, the entrance window 10 and the rotating mirror 9, and is received by the photodetector at a predetermined measurement frequency (number of measurements per unit time). In the direct reflection method, thus, the laser beam emitted by the laser beam source is projected directly onto the melt surface 7, and the return beam reflected on the melt surface 7 is received directly by the photodetector 13.

When the melt level of the melt surface 7 is positioned at a position A1, the laser beam reflected on the melt surface 7 is detected at a measurement coordinate X1 in the linear CCD sensor 13b. That is, the measurement coordinate X1 of the linear CCD sensor 13b corresponds to the melt level A1. Likewise, when the melt level is positioned at a position A2, the laser beam reflected on the melt surface 7 is detected at a measurement coordinate X2 in the linear CCD sensor 13b. That is, the measurement coordinate X2 of the linear CCD sensor 13b corresponds to the melt level A2. The melt level can thus be worked out, by triangulation, from the measurement coordinates detected by the linear CCD sensor 13b.

The incidence angle and the reflection angle (both angle θ1) of the laser beam on the melt surface 7 have been exaggerated in the figure. In actuality, the angle θ1 is small, of several degrees. The same is true in other instances.

Patent document 2: WO 01/083859 discloses a method for measuring melt level by causing a laser beam emitted by a laser beam source to be scattered once on the lower face of a heat shield, and to be reflected twice on a melt surface. This measuring method will be referred to hereafter as "return reflection method".

FIG. 19 is a diagram for explaining the trajectory of a laser beam in the return reflection method.

FIG. 19A is a schematic diagram of the trajectory of a laser beam as viewed laterally (X-Y plane). FIG. 19B is a schematic diagram of the trajectory of a laser beam as viewed from the front (X-Z plane). In FIG. 19A, the laser beam is guided by the rotating mirror 9 and the prism 11. In FIG. 19B, the rotating mirror 9 and the prism 11 are omitted, since the trajectory of the laser beam in the Y-axis direction is perpendicular to the paper. To simplify the explanation, portions not essential to triangulation will be omitted.

In FIG. 19B, the range-finding unit 8 has provided therein a laser beam source 12 that emits a laser beam and a photodetector 13 that receives a reflected return beam. A lens 13a that condenses the incident laser beam and a linear CCD sensor 13b that detects the condensed laser beam are provided in the photodetector 13.

In FIGS. 19A and B, a laser beam emitted by the laser beam source 12 is reflected by the rotating mirror 9 and the prism 11 and is projected onto the melt surface 7. The projected laser beam is reflected on the melt surface 7 (melt level A4), and the reflection beam is projected onto the lower face 6 of the rim 5a of the heat shield 5 provided above the melt surface 7. The projected laser beam is scattered at a scattering point 6a on the lower face 6 of the heat shield, and the scattered scatter beam is projected again onto the melt surface 7. The projected laser beam is reflected again on the melt surface 7, and the resulting reflection beam is finally received by the photodetector 13.

That is, the laser beam received by the photodetector 13 is the reflection beam of the laser beam projected onto the melt surface 7 from the scattering point 6a of the lower face 6 of the rim 5a. As viewed from the photodetector 13, the laser beam is detected as being emitted from a scattering point 3a on an apparent reflection surface.

In FIG. 19B, the incidence angle and the reflection angle of the laser beam in the X-Z plane have the same value at all times. In simple geometrical terms, the scattering point 3a on the apparent reflection plane and the scattering point 6a on the lower face 6 of the rim 5a of the heat shield 5 have a fold-back positional relationship (specular relationship) relative to the actual melt level A4. The apparent reflection plane will be referred to hereafter as melt level A3. To better grasp the apparent laser beam trajectory, the position of an apparent heat shield 5c, resulting from specular replication of the heat shield 5 at the actual melt level A4, is depicted in broken lines in FIG. 19B. Therefore, the gap between the lower face 6 of the rim 5a and the apparent melt level A3 is 2L.

The position of the lower face 6 of the rim 5a can be determined by measuring, for instance, the position of the top face 9 of the rim 5a. In FIG. 19, the position of a reflection point 9a of the laser beam at the top face 9 of the rim 5a corresponds to a measurement coordinate X9 of the linear sensor. If a distance M between the top face 9 and the lower face 6 is measured beforehand, the position of the lower face 6 of the rim 5a can be determined from the measurement coordinate X9 and the distance M.

The gap L can be determined as half the value of the relative distance 2L between the position of the lower face 6 of the rim 5a and the apparent melt level A3. The actual melt level A4 can be determined as a value standing above the melt level A3 by the gap L.

An inclined portion including a surface-tension meniscus (hereinafter, "inclined portion") is formed at the site where the outer wall of the pulled single crystal comes into contact with the melt surface. The inclination angle increases in the vicinity of the outer wall of the single crystal. Also, the entire melt surface exhibits a paraboloid shape resulting from the rotation of the crucible and the rotation of the pulled single crystal. When the heat shield, which straightens gas flow, stands close to the melt surface, the melt surface close to the underside of the heat shield may take on a concave shape on account of the discharge pressure of infused gas. The inclination of the melt surface shifts the angle of the reflection beam of the laser beam, and hampers stable detection of the beam. The shape of the inclined portion varies depending on the manufacturing conditions, and hence the shape of the inclined portion must be actually measured or estimated in accordance with the manufacturing conditions.

The direct reflection method has a drawback in that the gap D decreases when there is set a large diameter of the pulled single crystal, and in consequence, the laser beam is reflected on a large-inclination spot. The reflection direction of the laser beam shifts as a result, so that the reflected laser beam may fail to return to the photodetector at predetermined measurement frequencies, in which case the probability of receiving the reflection beam (hereafter, "beam reception probability") becomes zero.

On the other hand, the direct reflection method is advantageous in that the melt surface 7 is used as a direct reflection body, so that the distance L can be measured irrespective of whether it is large or small. Moreover, the return beam is a direct reflection beam from the melt surface 7, and hence laser power may be small.

The return reflection method is advantageous in that it affords a comparatively high beam reception probability, even when the gap D is small, since the method utilizes a scatter beam from the lower face 6 of the rim 5a.

On the other hand, the return reflection method has a drawback in that the intensity of the scatter beam scattered on the lower face 6 of the rim 5a is weak, and the laser beam is reflected twice on the melt surface 7. As a result, the intensity of the laser beam ultimately received by the photodetector is weak. That is, the return reflection method requires greater laser power. Also, reducing the value of the gap L in order to control the quality of the single crystal gives rise to a lower beam reception probability, on account of the structure by which the laser beam is scattered at the lower face 6 of the rim 5a.

As described above, an inclined portion forms in the vicinity of the site at which the outer wall of the pulled growing single crystal comes into contact with the melt surface. The reflection site on the melt surface is different in the direct reflection method and the return reflection method, and hence the influence exerted by the inclined portion on beam reception probability is likewise different.

FIG. 20 is a diagram for explaining the influence of the inclined portion on the direct reflection method and the return reflection method.

In FIG. 20, the reflection site is set on the melt surface 7, in the vicinity of the inner diameter of the heat shield 5, for the return reflection method. For the direct reflection method, by contrast, the reflection site is set on the melt surface 7 shifted by a predetermined distance from the inner diameter of the rim 5a towards the center of the crucible. In the direct reflection method, therefore, the reflection site is closer to the outer wall of the single crystal than is the case in return reflection method. The influence of the inclined portion is therefore greater in the direct reflection method. Moreover, the influence of the inclined portion becomes more significant as the outer diameter of the pulled single crystal increases.

In the return reflection method, the reflection site is set in the vicinity of the inner diameter of the rim 5a, and hence the influence of the inclined portion is less than in the case of the direct reflection method. Nevertheless, the influence of the inclined portion cannot be neglected when the outer diameter of the pulled silicon single crystal increases and the gap D narrows.

As described above, both the direct reflection method and return reflection method have advantages and drawbacks. It is therefore not easy for an operator to decide which reflection method to use according to the manufacturing conditions.

In the light of the circumstances above, it is an object of the invention of the present application to provide a method that allows measuring a liquid level, reliably and easily, by selecting an optimal reflection method, from among a plurality of reflection methods, in accordance with the growth conditions of a pulled single crystal.

Means to Solve the Problems

With a view to achieving the above object, a first aspect of the present invention is a method for measuring a liquid level in a single crystal pulling apparatus employing a CZ method, in which, in a CZ furnace provided with a heat shield surrounding a periphery of a single crystal to be pulled up out of a raw material melt held in a crucible and having a rim at a lower end thereof, a laser beam emitted by a laser beam source is projected onto a melt surface, the laser beam reflected on the melt surface is received, and the liquid level of the melt surface is measured based on the principle of triangulation, the method comprising: setting a plurality of measuring methods having different ways of determining the liquid level; creating, in advance, information that associates any of the plurality of measuring methods to each gap from a predetermined position, set between an outer peripheral face of the single crystal and the heat shield, up to the outer peripheral face of the single crystal; determining the gap in accordance with manufacturing conditions; selecting a measuring method associated to the determined gap, on the basis of the information; and measuring the liquid level of the melt surface in use of the selected measuring method.

The first aspect of the present invention is explained based on the process diagram of FIG. 7 of Embodiment 1. The method for measuring melt level of the invention of the present application employs reflection beams. Except where misunderstanding might arise, the measuring method will therefore be referred to as "reflection method".

In FIG. 7, the operator obtains in advance the outer diameter of a single crystal being pulled up and grown (S10). Next, the operator determines a gap D1 on the basis of the outer diameter of the single crystal and the position of a perpendicular line drawn from the end of a prism in a CZ furnace (S11), and inputs the determined gap D1 into a control unit 20 (S12). The control unit compares the inputted gap D1 with a condition table of FIG. 6 stored beforehand (S13), and selects an optimal reflection method (S14). Next, during pulling and growth of the single crystal, the control unit measures the melt level using the selected reflection method (S15).

In the first aspect of the present invention, thus, information obtained in advance is compared with information created beforehand that associates any of a plurality of measuring methods to each gap from a predetermined position set between the outer peripheral face of the single crystal and the heat shield, up to the outer peripheral face of the single crystal; an optimal reflection method is selected; and the liquid level is measured using the selected reflection method.

A second aspect of the present invention is a method for measuring a liquid level in a single crystal pulling apparatus employing a CZ method, in which, in a CZ furnace provided with a heat shield surrounding a periphery of a single crystal to be pulled up out of a raw material melt held in a crucible and having a rim at a lower end thereof, a laser beam emitted by a laser beam source is projected onto a melt surface, the laser beam reflected on the melt surface is received, and the liquid level of the melt surface is measured based on the principle of triangulation, the method comprising: setting a plurality of measuring methods having different ways of determining the liquid level; creating, in advance, information that associates any of the plurality of measuring methods to each gap from a predetermined position, set between an outer peripheral face of the single crystal and the heat shield, up to the outer peripheral face of the single crystal; carrying out an actual measurement of the gap during the pulling and growth of the single crystal; selecting a measuring method associated to the gap obtained by the actual measurement, on the basis of the information; and measuring the liquid level of the melt surface in use of a selected reflection method.

The second aspect of the present invention is explained based on the process diagram of FIG. 15.

In FIG. 15, the operator inputs a gap D2, which is determined by the construction of a CZ furnace, into a control unit (S30). Then, measuring means scans a laser beam towards the outer periphery of a crucible, and detects the position of the end of a heat shield 5, on the basis of the large difference between the reflectance of a reflection beam upon striking the end of the heat shield 5 and the reflectance of the reflection beam from the melt surface 7 (S31), and determines a rotation angle $\theta 2$ corresponding to that position (S32). Next, the measuring means scans a laser beam towards the center of the crucible, and detects the position of the outer wall of a single crystal on the basis of the large difference between the reflectance of a reflection beam upon striking the outer wall of the pulled single crystal and the reflectance of the reflection beam from the melt surface 7 (S33), and determines a rotation angle $\theta 3$ corresponding to that position (S34). Next, the measuring means calculates a gap D on the basis of the schematic diagram of FIG. 12, the rotation angle $\theta 2$ and the rotation angle $\theta 3$ (S35), and automatically inputs the calculated gap D into a control unit (S36). The control unit calculates a gap D1 on the basis of the inputted gap D and the gap D2 inputted beforehand (S37), and compares the calculated gap D1 with a condition table of FIG. 6 stored beforehand (S38). Next, the control unit selects an optimal reflection method from among three reflection methods (S39), and measures the melt level using the selected reflection method during pulling and growth of the single crystal (S40).

In the second aspect of the present invention, thus, information measured by a measuring means is compared with information created, in advance, that associates any of a plurality of measuring methods to each gap from a predetermined position set between the outer peripheral face of the single crystal and the heat shield, up to the outer peripheral face of the single crystal; an optimal reflection method is selected; and the liquid level is measured using the selected reflection method.

A third aspect of the present invention is in accordance with the first aspect of the present invention or the second aspect of the present invention, wherein the plurality of measuring methods are a measuring method of causing a laser beam emitted by the laser beam source to be reflected on the melt surface, and receiving thereafter the reflected laser beam; a measuring method of causing a laser beam emitted by the laser beam source to be reflected on the melt surface, causing then the reflected laser beam to be scattered and reflected on the lower face of a rim provided at the lower end of the heat shield, causing then the scattered and reflected laser beam to be reflected on the melt surface, and receiving thereafter the reflected laser beam; and a measuring method of causing a laser beam emitted by the laser beam source to be reflected on the melt surface, causing then the reflected laser beam to be reflected on the inner peripheral face of a rim provided at the lower end of the heat shield, and receiving thereafter the reflected laser beam, or causing the laser beam emitted by the laser beam source to be reflected on the inner peripheral face of the rim provided at the lower end of the heat shield, causing then the reflected laser beam to be reflected on the melt surface, and receiving thereafter the reflected laser beam.

In the third aspect of the present invention, thus, three different measuring methods are used; an optimal reflection method is selected from among them; and the liquid level is measured using the selected reflection method.

A fourth aspect of the present invention is in accordance with any one of the first aspect of the present invention through the third aspect of the present invention, wherein in the information, the plurality of measuring methods are further associated with the strength of a magnetic field that is applied to the single crystal pulling apparatus employing the CZ method.

A fifth aspect of the present invention is in accordance with any one of the first aspect of the present invention through the third aspect of the present invention, wherein in the information, the plurality of measuring methods are further associated with a gap between the lower face of the heat shield and the melt surface.

Effects of the Invention

According to the first aspect of the present invention, an optimal reflection method can be selected even if the gap D1, i.e. the gap D varies widely. As a result, the melt level can be measured reliably and stably.

According to the second aspect of the present invention, an optimal reflection method can be selected on the basis of a gap D actually measured. As a result, the melt level can be measured reliably and easily using the optimal reflection method.

According to the third aspect of the present invention, an optimal reflection method is selected from among three reflection methods, and melt level is measured using the selected reflection method. As a result, the melt level can be measured reliably and easily.

According to the fourth and fifth aspects of the present invention, an optimal method can be selected on the basis of other information. As a result, the melt level can be measured yet more reliably and easily using the optimal reflection method.

BRIEF DESCRIPTION OF THE DRAWINGS

FIG. 8 is a diagram illustrating a comparison of reflection paths within a CZ furnace, in the X-Y plane, for the three reflection methods;

FIG. 9 is an example of a condition table for the three reflection methods using a gap D and a gap L, determined experimentally, as parameters;

FIG. 10 is a process diagram of Embodiment 2;

FIG. 11 is a table in which beam reception probability is compared for the three reflection methods, depending on the presence or absence of a magnetic field;

EXPLANATION OF REFERENCE NUMERALS

Figures 1A, 1B:
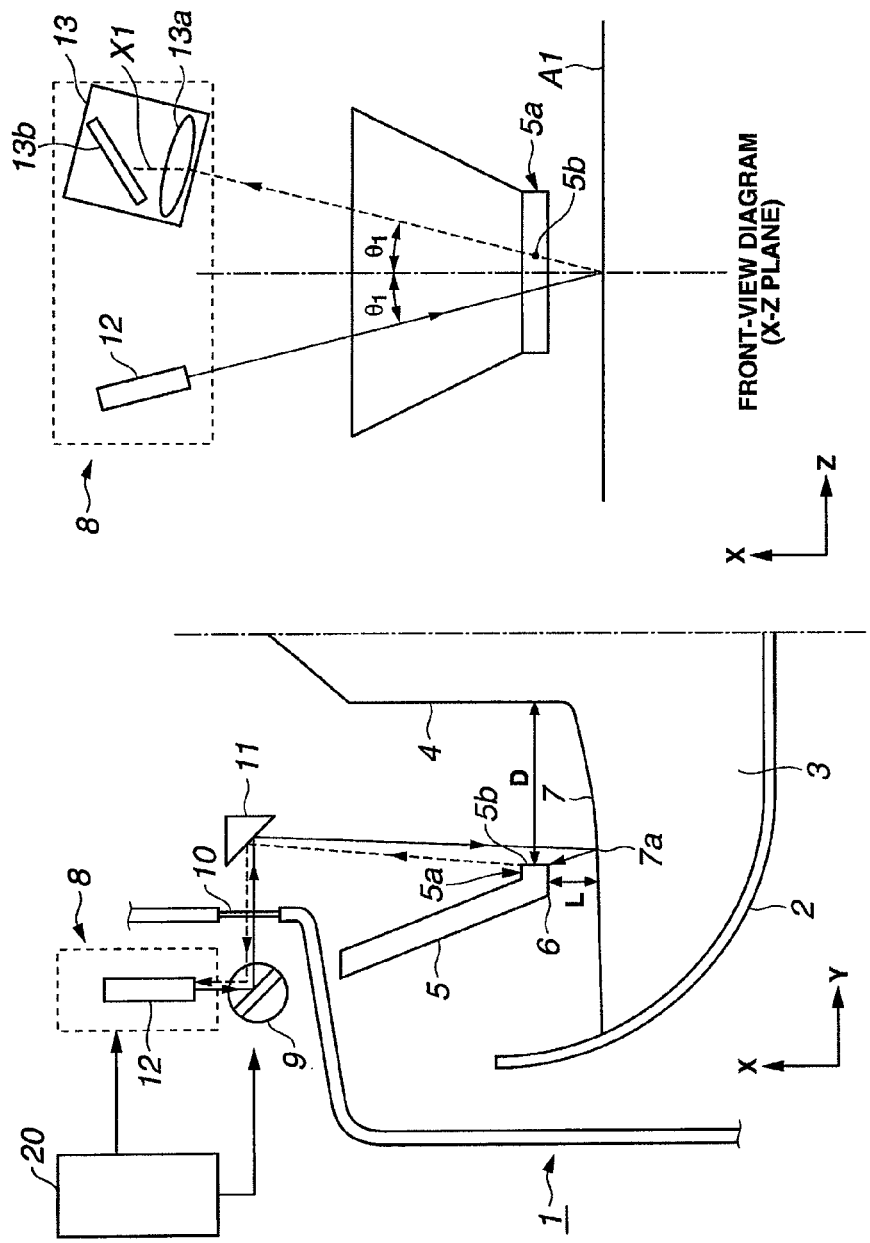
FIG. 1 is a diagram for explaining a side-face reflection method newly used in the invention of the present application.

A1 to A4 melt level
D gap between the side face of a rim of a heat shield and the peripheral wall of a pulled single crystal
L gap between the lower face of a heat shield and a melt surface
1 CZ furnace
2 crucible
3 silicon raw material
4 silicon single crystal
5 heat shield
7 melt surface
8 range-finding unit
9 rotating mirror
10 entrance window
11 prism
12 laser beam source
13 photodetector
13a lens
13b linear CCD sensor
13c two-dimensional optical sensor
13d splitter
13e light-attenuating filter
20 control unit
22 gate valve

BEST MODE FOR CARRYING OUT THE INVENTION

An embodiment of a method for measuring liquid level in a single crystal pulling apparatus using the CZ method of the present invention will be explained next with reference to accompanying drawings.

The explanation will feature first the reflection method (hereinafter, "side-face reflection method") newly used in the invention of the present application, and will feature next a liquid level measuring method of the invention of the present application. In the embodiment below, a red laser beam is used as a light source, but the embodiment will be explained using simply a laser beam, for convenience.

(Side-Face Reflection Method)

FIG. 1 is a diagram for explaining a side-face reflection method newly used in the invention of the present application. The reflection method using the reflection path of FIG. 1 will be referred to as the "side-face reflection method A".

FIG. 1A is a schematic diagram of the trajectory of a laser beam in the side-face reflection method as viewed laterally (X-Y plane). FIG. 1B is a schematic diagram of the trajectory of a laser beam in the side-face reflection method as viewed from a front face (X-Z plane). In FIG. 1A, the laser beam is guided by a rotating mirror 9 and a prism 11. In FIG. 1B, the rotating mirror 9 and the prism 11 are omitted, since the trajectory of the laser beam in the Y-axis direction is perpendicular to the paper. To simplify the explanation, portions not essential to triangulation will be omitted.

In FIGS. 1A and B, a silicon raw material 3 is melted inside a crucible 2 provided in a CZ furnace 1. A silicon single crystal 4 is pulled up and grown, while rotating toward the upper portion of the figure. A heat shield 5 is disposed outside the silicon single crystal 4. Herein, D denotes the gap between the peripheral wall of the silicon single crystal 4 and a side face 5b of a rim 5a provided at the lower end of the heat shield 5, while L denotes the gap between a lower face 6 of the rim 5a and a melt surface 7.

In the invention of the present application, "side face" means a face that is not tilted by more than 0.5 degrees relative to a perpendicular plane.

A range-finding unit 8 based on the principle of triangulation is used to measure a melt level A1 of the melt surface 7. In the range-finding unit 8 there are provided a laser beam source 12 that projects a laser beam onto the melt surface 7, and a photodetector 13 that receives the laser beam reflected on the melt surface 7. A lens 13a that condenses the incident laser beam and a linear CCD sensor 13b that detects the condensed laser beam are provided in the photodetector 13.

The range-finding unit 8 and the rotating mirror 9 are controlled by a control unit 20. As described below, the control unit 20 selects a specific reflection method out of a plurality of reflection methods, on the basis of values of a condition table.

The laser beam emitted by the laser beam source 12 of the range-finding unit 8 is reflected on the rotating mirror 9, passes through an entrance window 10 and through a prism 11 disposed in the CZ furnace 1, and strikes directly the melt surface 7.

The reflection beam reflected on the melt surface 7 strikes the side face 5b of the rim 5a, provided in the vicinity of the melt surface 7, at a low angle, no greater than 0.5 degrees, close to incidence substantially parallel to the side-face direction. Next, the reflection beam reflected at the same low angle is guided by the prism 11, the entrance window 10 and the rotating mirror 9, and is received by the photodetector 13.

The rotating mirror 9 may be appropriately rotated in order for the laser beam to strike reliably the side face 5b of the rim 5a. For instance, scanning can be implemented in a radial direction of the crucible 2 in the CZ furnace 1 by the rotating mirror 9. Alternatively, accurate alignment may be implemented by fixing the rotating mirror 9 beforehand.

In the X-Z plane of FIG. 1B, the laser beam projected from the laser beam source 12 onto the melt surface 7 at an incidence angle $\theta 1$ is reflected on a reflection angle $\theta 1$. In the X-Y plane of FIG. 1A, the laser beam reflected on the melt surface 7 strikes the side face 5b of the rim 5a at a low angle, no greater than 0.5 degrees, close to incidence substantially parallel to the side-face direction, and is reflected. The angle in the X-Z plane does not change upon reflection on the side face 5b of the rim 5a; only the angle in the Y-axis direction does so. The laser beam advances towards the linear CCD sensor 13b without change in the angle $\theta 1$ in X-Z plane, and is detected at a measurement coordinate X1. The melt level A1 corresponds to the measurement coordinate X1 of the linear CCD sensor 13b.

As described above, in FIG. 1B, the angle of the laser beam in the X-Z plane does not change upon reflection on the side face 5b of the rim 5a. As a result, the height position in the X-axis direction, i.e. the melt level, can be measured by triangulation in the X-Z plane.

Figure 2:
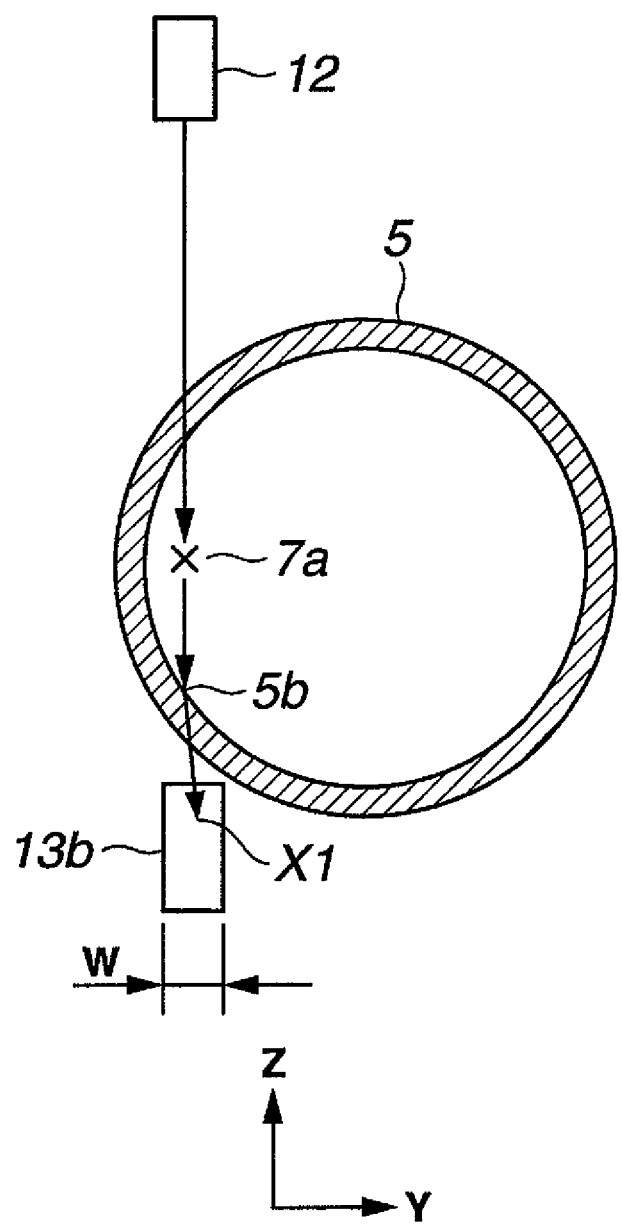
FIG. 2 is a schematic diagram of the trajectory of a laser beam in the side-face reflection method as viewed from above (Y-Z plane)

FIG. 2 is a schematic diagram of the trajectory of a laser beam in the side-face reflection method as viewed from above (Y-Z plane).

In FIG. 2, a laser beam emitted by the laser beam source 12, and reflected on a reflection point 7a of the melt surface 7, is reflected on the side face 5b of the rim 5a of the heat shield 5, whereupon there changes the angle of the laser beam in the Y-axis direction. The angle-changed laser beam is ultimately received by the linear CCD sensor 13b at the measurement coordinate X1. In order to receive the angle-changed laser beam, therefore, the offset distance of the laser beam at the beam reception position must be smaller than the width W of the linear CCD sensor 13b in the Y-axis direction. This is verified through preliminary calculations or experimentation.

FIG. 3 is a diagram for explaining a modification of the side-face reflection method. Hereinafter, the reflection method using the reflection path of FIG. 3 will be referred to as "side-face reflection method B".

Figure 3B:
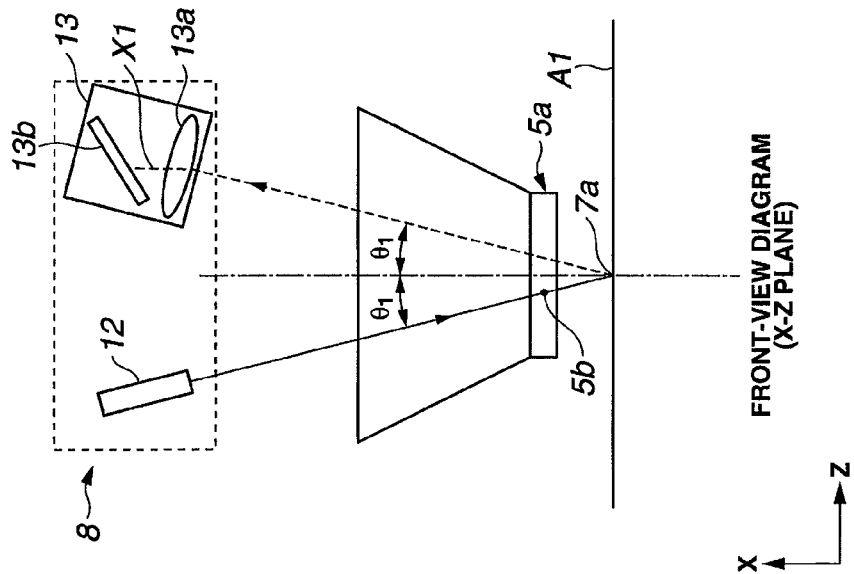
FIG. 3 is a diagram for explaining a modification of the side-face reflection method.
Figure 3A:
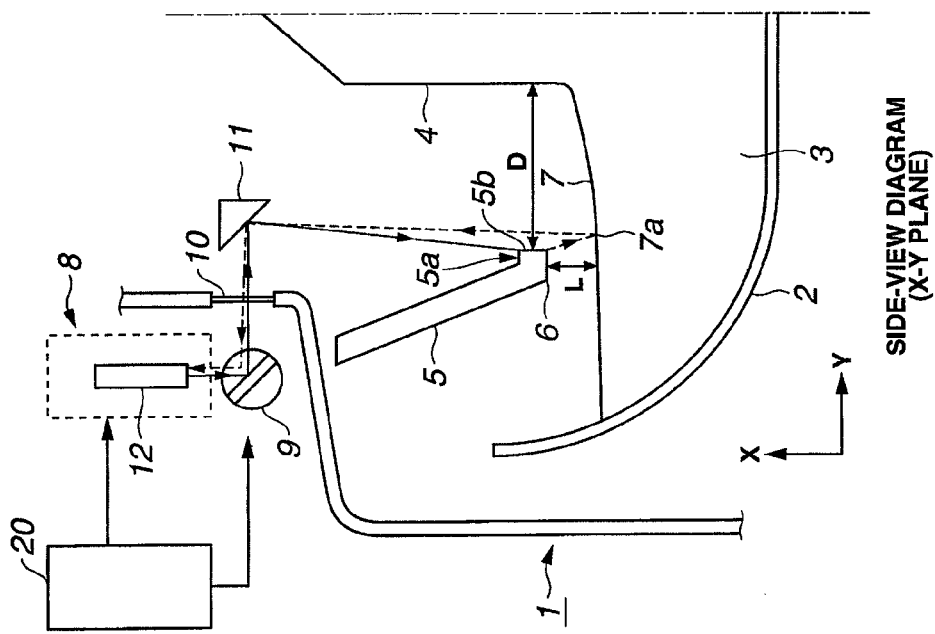

FIG. 3A is a schematic diagram of the trajectory of a laser beam in Embodiment 2 as viewed laterally (X-Y plane). FIG. 3B is a schematic diagram of the trajectory of a laser beam in Embodiment 2 as viewed from the front (X-Z plane). The side-face reflection method in Embodiment 2 differs from that of FIG. 1 as regards the trajectory of the laser beam; otherwise, the configuration of the embodiment is the same as in FIGS. 1A and 1B.

A laser beam emitted from the laser beam source 12 at an incidence angle $\theta 1$ in the X-Z plane is reflected first on the side face 5b of the rim of the heat shield 5, and the reflected reflection beam is projected then onto the melt surface 7. The angle of the laser beam in the X-Z plane does not change, only the angle of the laser beam in the Y-axis direction does so. That is, the incidence angle of the laser beam striking the melt surface 7, in the X-Z plane, is $\theta 1$. The laser beam is reflected on a reflection point 7a of the melt surface 7, and advances then towards the linear CCD sensor 13b, where it is detected at a measurement coordinate X1 corresponding to the melt level A1.

The rotating mirror 9 may be appropriately rotated in order for the laser beam to strike reliably the side face 5b of the rim 5a. For instance, by the rotating mirror 9, scanning can be implemented in a radial direction of the crucible 2 in the CZ furnace 1. Alternatively, accurate alignment may be implemented by fixing the rotating mirror 9 beforehand.

According to FIG. 3B, the angle of the laser beam in the X-Z plane does not change. As a result, the height position in the X-axis direction, i.e. the melt level, can be measured by triangulation on the basis of measurement in the X-Z plane. The melt level A1 can be determined from the measurement coordinate X1 of the linear CCD sensor 13b.

Figure 4:
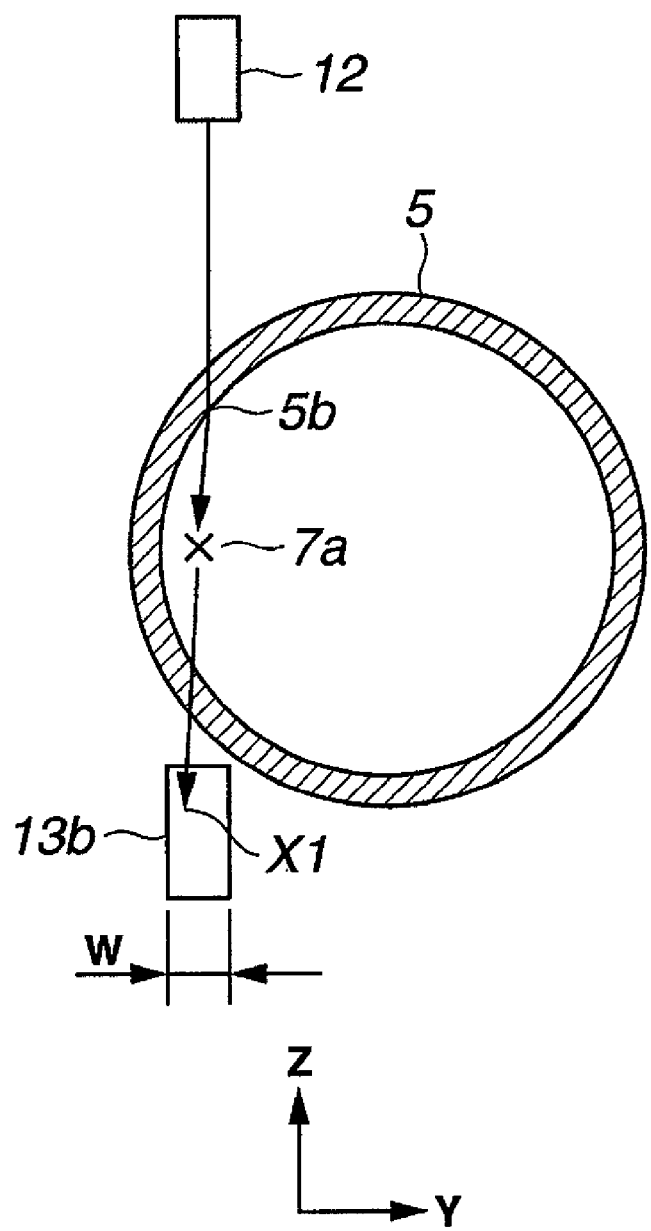
FIG. 4 is a schematic diagram of the trajectory of a laser beam as viewed from above (Y-Z plane)

FIG. 4 is a schematic diagram of the trajectory of a laser beam as viewed from above (Y-Z plane).

In FIG. 4, a laser beam emitted by the laser beam source 12 is reflected by the side face 5b of the rim of the heat shield 5, whereupon there changes the angle of the laser beam in the Y-axis direction. The angle-changed laser beam strikes the melt surface 7. The laser beam reflected on the reflection point 7a of the melt surface 7 is ultimately received by the linear sensor 13b. In order to receive the laser beam, the angle of which has been changed in the Y-axis direction, the offset distance of the laser beam at the beam reception position must therefore be smaller than the width W of the linear CCD sensor 13b in the Y-axis direction. This is verified through preliminary calculations or experimentation.

The side-face reflection method A and the side-face reflection method B differ only as to the point in time at which reflection takes place on the side face 5b of the rim of the heat shield 5. Otherwise, the effects and operations of the methods are basically the same.

According to the above side-face reflection method there is only one reflection on the melt surface, while the low-angle reflection method employed involves relatively no drop in the intensity of the reflected beam. This is advantageous in that, in consequence, laser power need not be increased.

An embodiment of a method for measuring liquid level in a single crystal pulling apparatus using the CZ method of the invention of the present application will be explained next.

Embodiment 1

In Embodiment 1, a specific reflection path is selected from among three reflection paths on the basis of one parameter, namely a gap D1.

Figure 5:
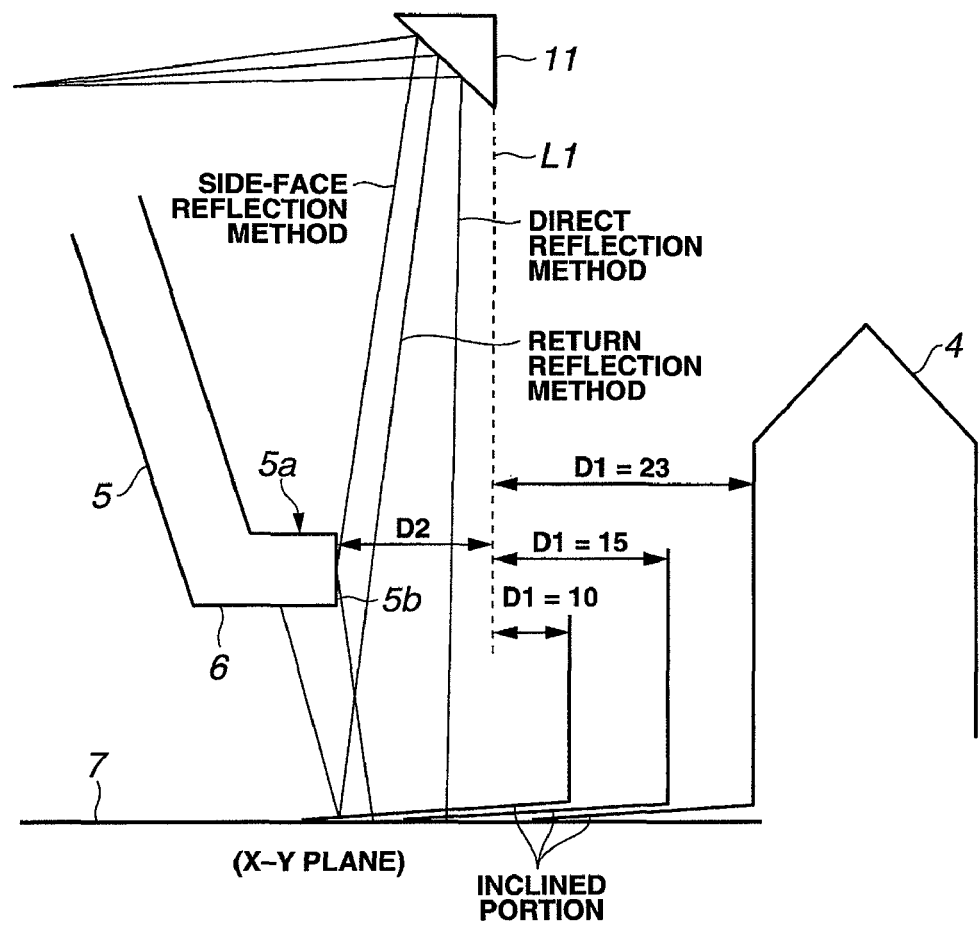
FIG. 5 is a diagram illustrating reflection paths of three reflection methods as well as the arrangement of a single crystal having three outer diameters.

FIG. 5 is a diagram illustrating reflection paths of three reflection methods as well as the arrangement of a single crystal having three outer diameters.

In FIG. 5, the reference numeral D1 denotes the gap between the outer periphery of a single crystal and a predetermined position defined by a perpendicular line L1 drawn from an end of the prism 11. The figure depicts a single crystal having three outer diameters for which the gap D1 is 10 mm, 15 mm and 23 mm.

The reference numeral D2 denotes the gap between the side face 5b of the rim 5a of the heat shield 5 and a predetermined position defined by a perpendicular line L1 drawn from an end of the prism 11. The gap D2 is determined by the construction of the CZ furnace. The gap D is the sum of the gap D1 and the gap D2, and hence the gap D1 can be easily worked out as D1=D−D2.

The predetermined position varies depending on parameters. The predetermined position in the gap D is the side face 5b of the rim 5a provided at the lower end of the heat shield. The gap D is defined as the gap between the above-mentioned predetermined position (side face 5b of the rim) and the outer peripheral face of the single crystal.

In a return reflection method and a side-face reflection method, a reflection site is set on the melt surface 7, in the vicinity of the inner diameter of the rim 5a of the heat shield 5. In a direct reflection method, by contrast, the reflection site set on the melt surface 7 is moved towards the center of the crucible by a predetermined distance from the inner diameter of the rim 5a of the heat shield 5.

The direct reflection method, therefore, works closer to the outer wall of the single crystal 2 than the return reflection method and the side-face reflection method, and is therefore influenced to a greater extent by the inclined portion. The influence of the inclined portion becomes more significant as the outer diameter of the pulled single crystal increases.

In the return reflection and side-face reflection methods, the measurement point is set in the vicinity of the inner diameter of the rim 5a of the heat shield 5. Therefore, the influence of the inclined portion is less significant than in the case of the direct reflection method. Nevertheless, the influence of the inclined portion cannot be neglected when the outer diameter of the pulled silicon single crystal 4 increases and the gap D1 narrows.

Figure 6:
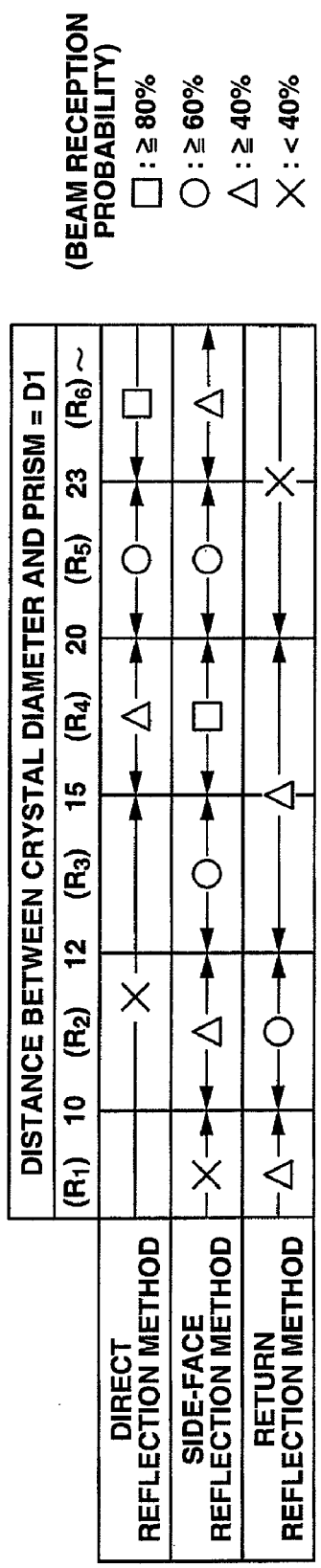
FIG. 6 is a diagram illustrating a relationship, obtained experimentally, between a gap D1 and beam reception probability, for the three reflection methods.

FIG. 6 is a diagram illustrating a relationship, obtained experimentally, between the gap D1 and beam reception probability, for the three reflection methods.

In FIG. 6, sign □ denotes a beam reception probability of 80% or more. Sign O denotes a beam reception probability of 60% or more but less than 80%. Sign Δ denotes a beam reception probability of 40% or more but less than 60%. Sign × denotes a beam reception probability of less than 40%. A region R1 corresponds to D1 up to 10 mm, a region R2 corresponds to D1 from 10 mm up to 12 mm, a region R3 corresponds to D1 from 12 mm up to 15 mm, a region R4 corresponds to D1 from 15 mm up to 20 mm, a region R5 corresponds to D1 from 20 mm up to 23 mm, and a region R6 corresponds to D1 from 23 mm upwards.

An explanation follows next on the relationship between the gap D1 and beam reception probability for each reflection method.

(1) Direct Reflection Method

Regions R1 to R3 exhibit ×. Region R4 exhibits Δ. Region R5 exhibits O. Region R6 exhibits □. It can be estimated that the influence of the inclined portion is negligible at region R6.

Thus, in the direct reflection method, measurement by direct reflection becomes more preferable as the gap D widens or more specifically as the gap D1 widens. Measurement is difficult at regions R1 to R3. Region R6 is most preferable.

(2) Return Reflection Method

Region R1 exhibits Δ. Region R2 exhibits O. Regions R3 and R4 exhibit Δ. Regions 5 and 6 exhibit ×.

In the return reflection method, the influence of the inclined portion is smaller than in the direct reflection method, and hence measurement is possible even with a small D1. However, the beam reception probability drops at region R1. The cause for this is unclear, but the effect of the inclined portion is thought to be involved. Beam reception is difficult at regions R5 and R6. The cause is likewise unclear here, but is believed to arise from the meniscus effect and also from the shape of the liquid surface that results from, for instance, gas flow and the rotation of the pulled single crystal.

As described above, the return reflection method is a suitable reflection method when the gap D1 is small. Region R2 is most preferable here.

(3) Side-Face Reflection Method

Region R1 exhibits ×. Region R2 exhibits Δ. Region R3 exhibits O. Region R4 exhibits □. Region R5 exhibits O. Region R6 exhibits Δ.

As described above, the side-face reflection method is widely appropriate, and region R4 is the most preferable.

In Embodiment 1, therefore, there is set a condition table denoting the correspondence between the gap D1 and beam reception probability in the three reflection methods. A specific reflection method is selected then by comparing an estimated gap D1 with the condition table. The melt level in the CZ furnace is measured then by using the selected reflection method.

Specifically, an operator calculates the gap D1 on the basis of the outer diameter of the pulled single crystal to be produced, and inputs the calculated gap D1 into a control unit. The control unit compares the inputted gap D1 with the condition table of FIG. 6, and selects an optimal reflection method. For instance, if the gap D1 is in region R1, the control unit selects the return reflection method, and measures the melt level using the selected return reflection method. The specific reflection method can be selected by setting the rotating mirror 9 of FIG. 1 to a predetermined position corresponding to the respective reflection methods.

Figure 7:
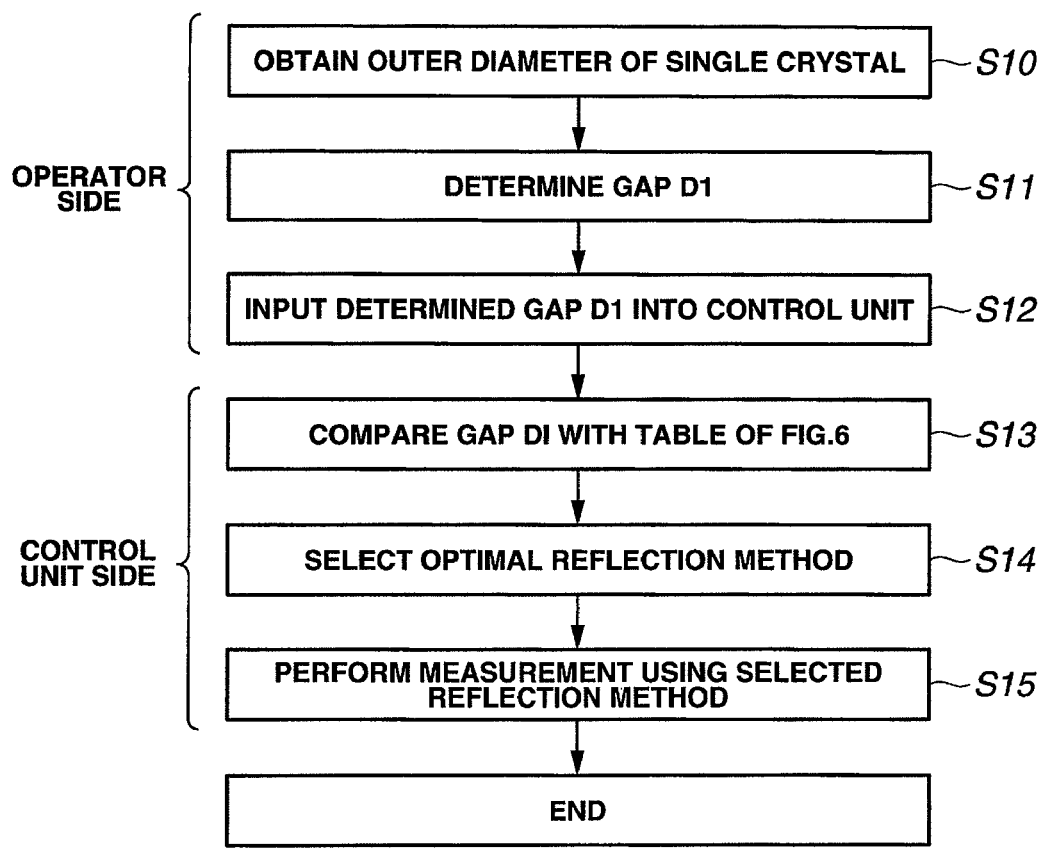
FIG. 7 is a process diagram of Embodiment 1.

FIG. 7 is a process diagram of Embodiment 1.

In FIG. 7, the operator obtains in advance the outer diameter of the single crystal being pulled up and grown (S10). Next, the operator determines the gap D1 on the basis of the outer diameter of the single crystal and the position of a perpendicular line drawn from the end of the prism in the CZ furnace (S11), and inputs the determined gap D1 into the control unit 20 (S12). The control unit compares the inputted gap D1 with the condition table of FIG. 6 stored beforehand (S13), and selects an optimal reflection method (S14). Next, during pulling and growth of the single crystal, the control unit measures the melt level using the selected reflection method (S15).

According to Embodiment 1, even if the gap D1 widely varies, an optimal reflection method can be selected according to the outer diameter of the single crystal to be produced, so that the melt level can be reliably and stably measured using the selected reflection method.

Embodiment 2

In Embodiment 1, a reflection path was selected from among three reflection paths on the basis of one parameter, namely the gap D1. However, two or more parameters may be used for selecting a specific reflection method.

A relationship between the gap L and beam reception probability will be explained first for the three reflection methods. The gap L is the distance between the lower face 6 of the rim 5a of the heat shield 5 and the melt surface 7.

FIG. 8 is a diagram illustrating a comparison of reflection paths within the CZ furnace, in the X-Y plane, for the three reflection methods. FIG. 8A illustrates a reflection path for the direct reflection method, FIG. 8B illustrates a reflection path for the return reflection method, and FIG. 8C illustrates a reflection path for the side-face reflection method.

As shown in FIG. 8A, in the direct reflection method, a laser beam emitted by a range-finding unit, not shown, and entering into the CZ furnace from the left of the figure, passes through a prism 11 arranged at the upper portion of the CZ furnace, and strikes directly the melt surface 7. The beam reflected on the melt surface 7 passes again through the prism 11, without change in reflection angle in the X-Y plane, and is received by a photodetector in the range-finding unit. In the direct reflection method, therefore, the reflection position on the melt surface 7 does not change, and thus the beam reception probability is not affected by the size of the gap L.

As shown in FIG. 8B, in the return reflection method, a laser beam emitted by a range-finding unit, not shown, and entering into the CZ furnace from the left of the figure, passes through a prism 11 arranged at the upper portion of the CZ furnace, and strikes directly the melt surface 7. The reflection beam reflected on the melt surface 7 strikes the lower face 6 of the rim 5a of the heat shield 5, is reflected thereon, strikes again the melt surface 7, and is reflected. This reflection beam passes again through the prism 11, and is received by a photodetector in the range-finding unit.

In FIG. 8B, the reflection position on the melt surface 7 moves towards the outer periphery of the crucible as the gap L widens. Therefore, in the return reflection method, the beam reception probability is affected by the size of the gap L.

As shown in FIG. 8C, in the side-face reflection method, a laser beam emitted by a range-finding unit, not shown, and entering into the CZ furnace from the left of the figure, passes through a prism 11 arranged at the upper portion of the CZ furnace, is reflected on the side face 5b of the rim 5a of the heat shield 5, and strikes thereafter the melt surface 7. The reflection beam reflected on the melt surface 7 passes again through the prism 11, and is received by a photodetector in the range-finding unit.

In FIG. 8C, as the gap L widens, the reflection position on the melt surface 7 moves towards the center of the crucible. Therefore, in the side-face reflection method, the beam reception probability is affected by the size of the gap L.

Thus, the gap L is no concern in the direct reflection method, but must be taken into consideration in the return reflection method and the side-face reflection method. The influence of the size of the gap L on beam reception probability is associated with the gap D, and must be ascertained experimentally.

FIG. 9 is an example of a condition table for the three reflection methods using the gap D and the gap L, determined experimentally, as parameters. The indicators of large, intermediate and small for the gap D and the gap L can be appropriately corrected based on experiments and manufacturing results. The signs for beam reception probability are defined in the same way as in the case of FIG. 6.

(Condition 1) Gap D Large, Gap L Intermediate

The side-face reflection method is exhibited by O, the direct reflection method is exhibited by □. The return reflection method is not carried out.

(Condition 2) Gap D Intermediate, Gap L Large

The side-face reflection method is exhibited by □. The direct reflection method is exhibited by × and the return reflection method is exhibited by Δ.

(Condition 3) Gap D Small, Gap L Large

The side-face reflection method and the return reflection method are exhibited by Δ, and the direct reflection method is exhibited by ×.

(Condition 4) Gap D Small, Gap L Small

The side-face reflection method is exhibited by Δ, and the direct reflection method and the return reflection method are exhibited by ×.

In Embodiment 2, a specific reflection method is selected from among three reflection paths, on the basis of two parameters, namely the gap D and the gap L. The melt level is measured by using the selected reflection method.

FIG. 10 is a process diagram of Embodiment 2.

In FIG. 10, the operator obtains in advance the outer diameter of the single crystal being pulled up and grown (S20), and determines the gap D on the basis of the inner diameter of the heat shield in the CZ furnace and the outer diameter of the single crystal (S21). Next, the operator obtains in advance, or in accordance with some other method, the gap L between the melt surface 7 and the lower face 6 of the heat shield 5 (S22), and inputs the determined gap D and gap L into the control unit 20 (S23). Next, the control unit compares the inputted gap D and gap L with the condition table of FIG. 9 (S24), and selects an optimal reflection method (S25). Next, during pulling and growth of the single crystal, the control unit measures the melt level using the selected reflection method (S26).

In the above method, the melt level can be measured stably and reliably by using a reflection method optimally selected through comparison with a condition table that exhibits a combination of the gap D and the gap L and is created beforehand, even when the gap D and the gap L vary widely.

In the condition table of FIG. 9, there are two parameters of the gap D and the gap L, but a further parameter, namely presence or absence of magnetic field, may also be introduced.

FIG. 11 is a table in which beam reception probability for each of the three reflection methods is compared with respect to whether the presence or absence of a magnetic field. In the present embodiment, the condition "magnetic field present" is defined as a magnetic field intensity of 1000 Gauss or more, while "magnetic field absent" is defined as a magnetic field intensity smaller than 1000 Gauss.

In FIG. 11, the side-face reflection method and the direct reflection method are exhibited by □, and the return reflection method is exhibited by Δ, when there is a magnetic field. When there is no magnetic field, the direct reflection method is exhibited by □, the side-face reflection method is exhibited by O, and the return reflection method is exhibited by ×. The signs □, O, Δ and × are defined in the same way as in FIG. 6.

When there is a magnetic field, the side-face reflection method and the direct reflection method provide the most stable measurement. When there is no magnetic field, the direct reflection method provides the most stable measurement.

Therefore, the optimal reflection method may be selected by combining the three parameters, namely, the two parameters gap D and gap L of FIG. 9 and the parameter of the presence or absence of a magnetic field of FIG. 11, and by inputting the three parameters into the control unit and comparing the parameters inputted to the control unit with the condition table.

The embodiments explained above include cases involving one parameter, two parameters and three parameters. When at the manufacturing site it is judged that, for instance, the gap D1 of the condition table of FIG. 6 is sufficient, the optimal reflection method may be selected on the basis of one parameter alone, namely the gap D1, without taking into consideration other parameters. Note that other parameter may also be added.

In the above embodiments, an optimal reflection method is selected from among three reflection methods. Depending on the circumstances, the reflection methods may be limited to two, for instance the direct reflection method and the side-face reflection method. The optimal reflection method may then be selected from among these two reflection methods on the basis of a plurality of parameters. In this case, the reflection methods are limited to two, and hence the optimal reflection method can be selected in a comparatively straightforward manner.

Embodiment 3

In Embodiment 1 and Embodiment 2, a specific reflection method is selected from among three reflection methods on the basis of predetermined parameters.

In Embodiment 3, the actual gap D and gap L are measured, during pulling of the single crystal, by a measuring means provided in the CZ furnace. A specific reflection method is then selected from among three reflection methods on the basis of measurement values.

An explanation follows first on a method for measuring the gap D and the gap L, and then on a measuring method that is based on the measurement values.

(1) Measurement of the Gap D

For instance, the method for measuring the gap D as disclosed in Patent document 1 can be used here as the method for measuring the gap D.

Figure 12:
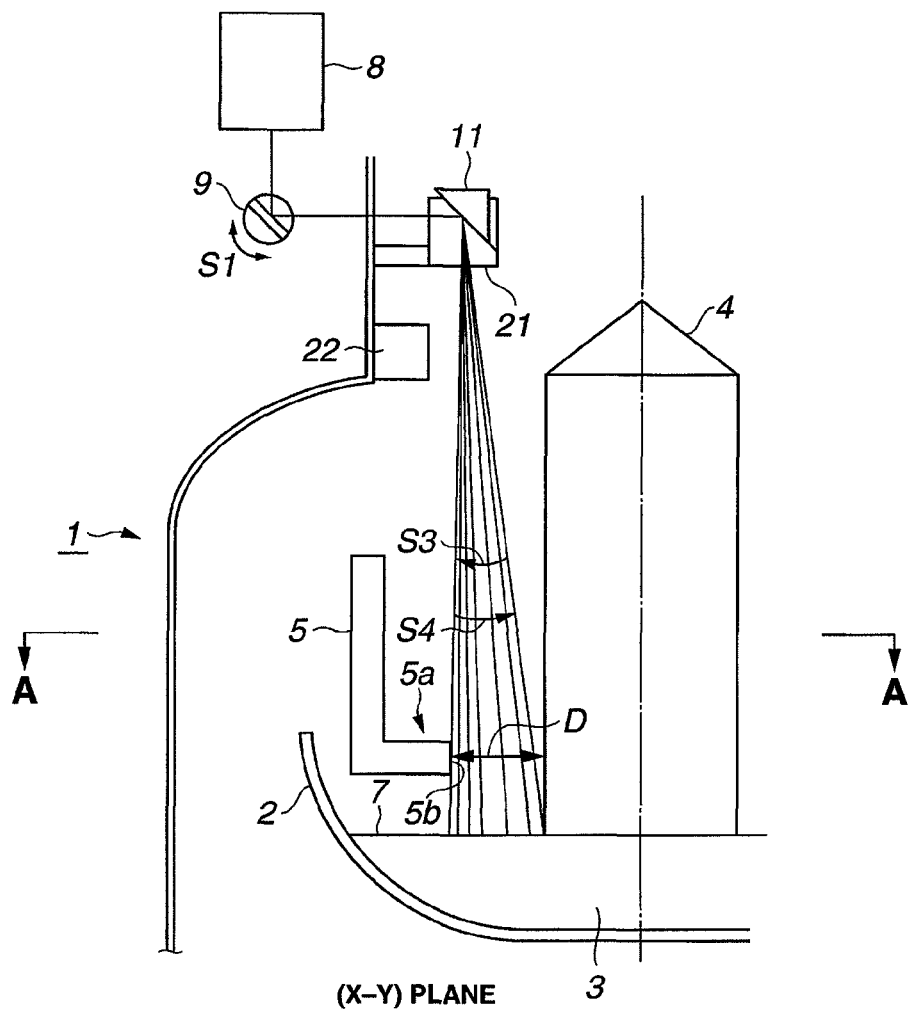
FIG. 12 is a diagram for explaining a method for measuring the gap D.
Figure 13:
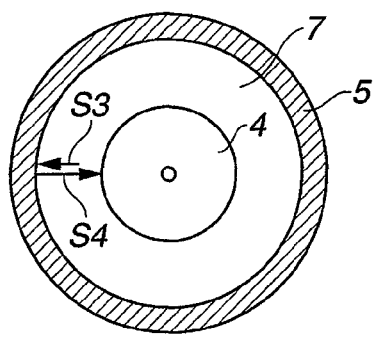
FIG. 13 is a cross-sectional diagram of the CZ furnace of FIG. 12 along a plane A-A.

FIGS. 12 and 13 are diagrams for explaining a method for measuring the gap D. FIG. 13 is a cross-sectional diagram of the CZ furnace of FIG. 12 along a plane A-A.

The silicon raw material 3 is melted inside the crucible 2 in the CZ furnace 1. A single crystal is pulled and grown on the top of the melt surface 7. The heat shield 5 is arranged in such a manner that the gap between the outer wall of the silicon single crystal 4 and the side face 5b of the rim 5a of the heat shield 5 is a gap D. The prism 11 is provided at the upper portion of the CZ furnace 1 by way of a support 21. A gate valve 22 is provided below the prism 11. A range-finding unit 8 and a rotating mirror 9 are provided outside the CZ furnace 1. A laser beam, which is scanned through rotation of the rotating mirror 9, moves in the direction of arrow S3 or the direction of arrow S4.

Figure 14:
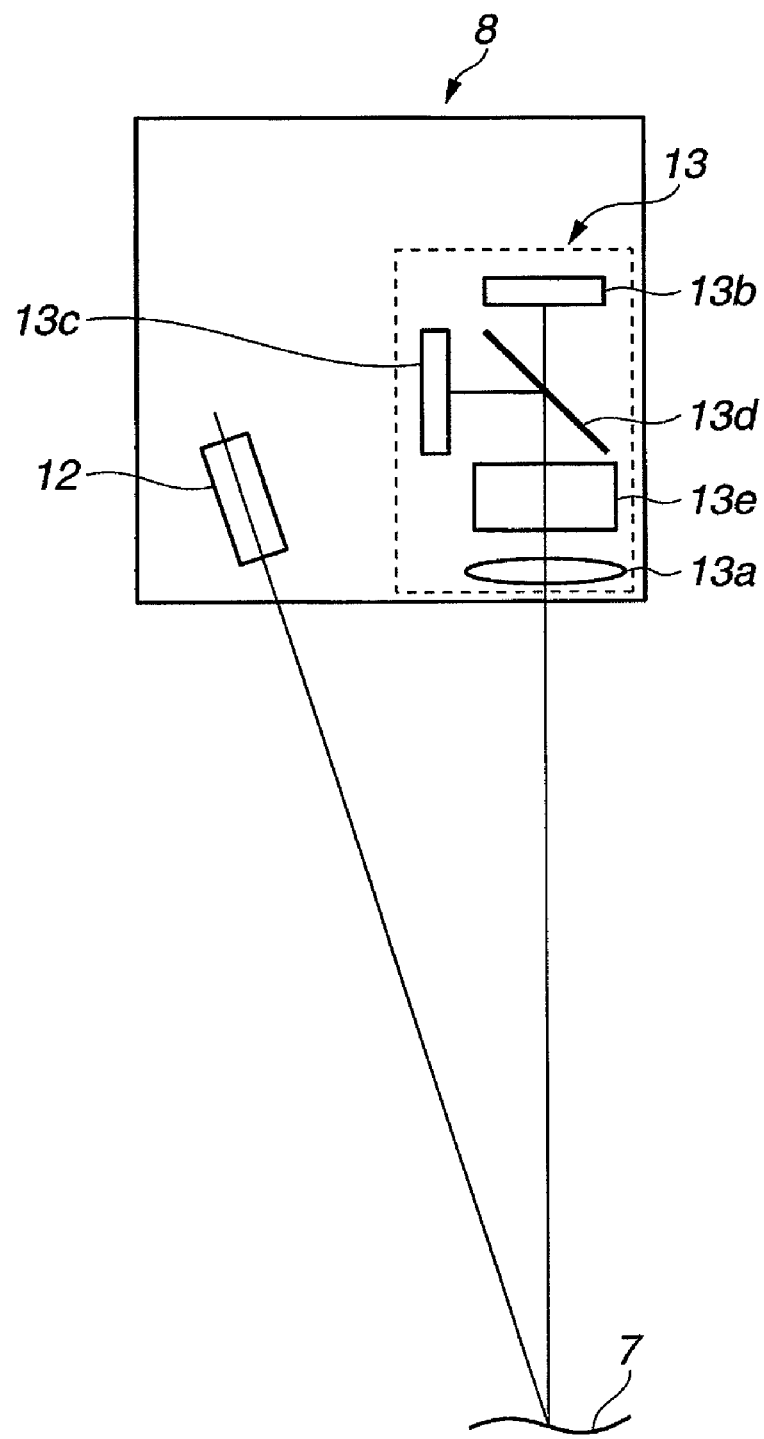
FIG. 14 is a schematic diagram of a range-finding unit used in Embodiment 3.

FIG. 14 is a schematic diagram of the range-finding unit used in Embodiment 3.

As illustrated in FIG. 14, the range-finding unit 8 has arranged therein a light-condensing lens 13a, a linear CCD sensor 13b, a light-attenuating filter 13e, a beam splitter 13d and a two-dimensional optical sensor 13c. The two-dimensional optical sensor 13c is arranged at a position conjugate with the linear CCD sensor 13b. The laser beam coming through the light-attenuating filter 13e is split by the beam splitter 13d. The reflectance at a measurement point is detected by the two-dimensional optical sensor 13c, whereas the melt level is measured by the linear CCD sensor 13b. The light-attenuating filter 13e is provided in order to cut radiation noise from the melt surface 7.

The range-finding unit 8 having the above-described configuration allows measuring the melt level by means of the linear CCD sensor 13b while detecting the reflectance at the reflection point by means of the two-dimensional optical sensor 13c. As described below, the difference between reflectances detected by the two-dimensional optical sensor 13c allow grasping whether the reflection point is positioned at the melt, at the heat shield or at the pulled single crystal.

In FIGS. 12 and 13, the laser beam is scanned as denoted by arrow S3, through rotation of the rotating mirror 9 (arrow S1). When the laser beam strikes the end of the rim 5a of the heat shield 5, the two-dimensional optical sensor 13c detects a laser beam having a reflectance different from that of the laser beam reflected on the melt surface 7. That is, it becomes possible to detect that the laser beam strikes the heat shield 5 at a scan position corresponding to a rotation angle θ2 of the rotating mirror 9.

The laser beam is scanned as denoted by arrow S4, through rotation of the rotating mirror 9 (arrow S1). When the scanned laser beam strikes the end (boundary with the melt surface) of the single crystal being pulled and grown out of the melt surface 7, the two-dimensional optical sensor 13c detects a laser beam having a reflectance different from that of the laser beam reflected on the melt surface 7. That is, it becomes possible to detect that the laser beam strikes the pulled single crystal at a scan position corresponding to a rotation angle θ3 of the rotating mirror 9.

The gap D between the inner diameter of the heat shield and the outer wall of the pulled single crystal can be calculated on the basis of the configuration diagram of FIG. 12, the detected rotation angle θ2, and rotation angle θ3. When a member such as a gate valve is present within the scan range, the member may be misrecognized. Therefore, it should be ensured that only the heat shield, the melt surface and the pulled single crystal are disposed within the scan range.

(2) Measurement of the Gap L

The gap L can be measured using any of the three reflection methods. If the used reflection method proves difficult, measurement can be carried out relying on one of the other reflection methods.

An explanation follows next on a measuring method based on the above-described measurement values D and L.

(Measuring Method Using the Measured Gap D)

In Embodiment 1, the gap D1 is used as a parameter for selecting the reflection method. As illustrated in FIG. 5, the gap D is the sum of the gap D1 between the outer peripheral face of the single crystal and a perpendicular line L1 drawn perpendicularly from the prism 11, and a gap D2 between the side face 5b of the rim 5a of the heat shield and the perpendicular line L1 drawn perpendicularly from the prism 11. The gap D2 is determined by the construction of the CZ furnace. The gap D1 can be easily worked out as D1=D−D2.

In the measuring method of Embodiment 3, the gap D1 is determined based on the gap D measured by measuring means provided in the CZ furnace. The determined gap D1 is then compared with the condition table of FIG. 6, to select thereby the optimal reflection method.

Figure 15:
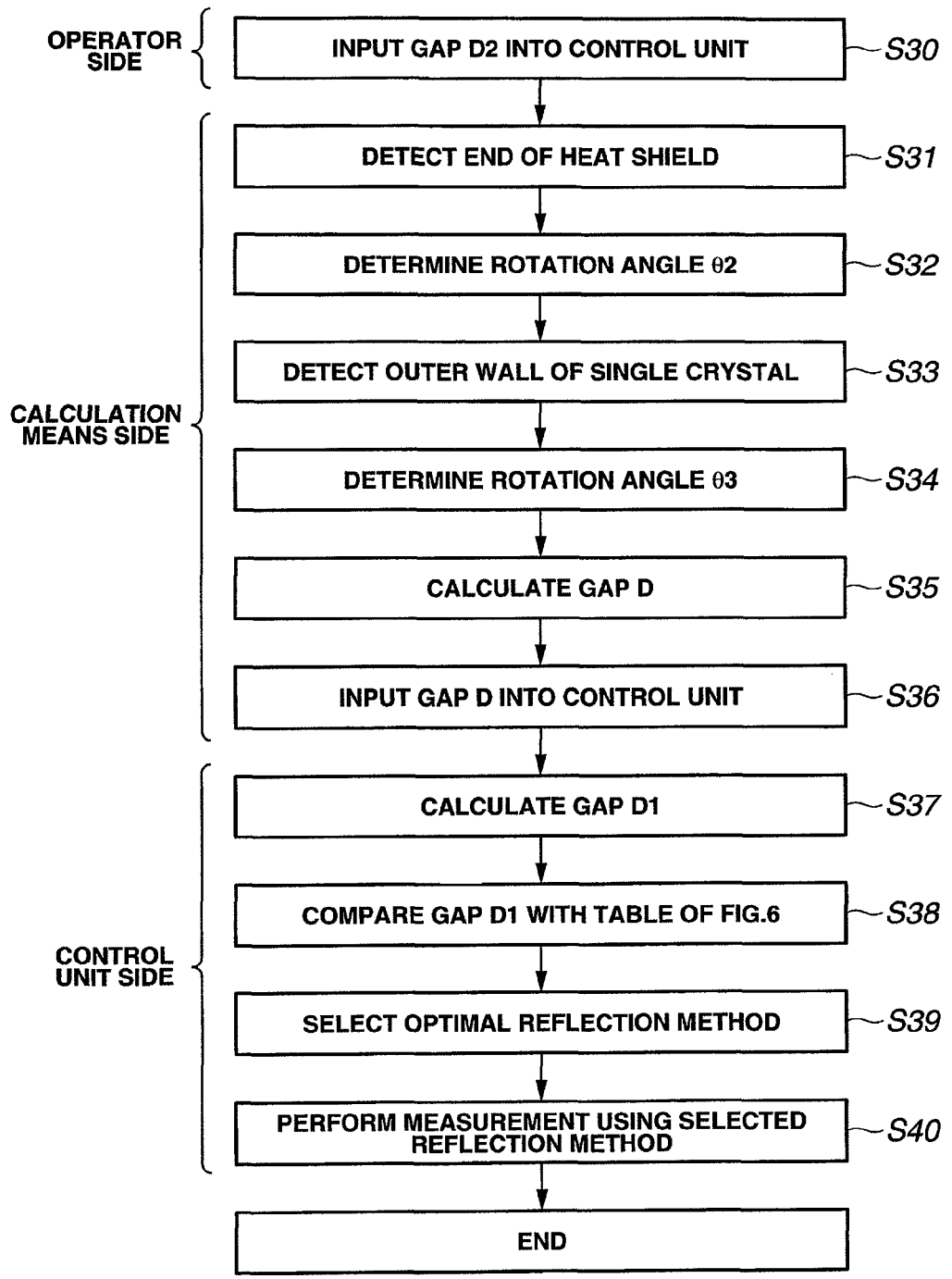
FIG. 15 is a process diagram of Embodiment 3.

FIG. 15 is a process diagram of Embodiment 3.

In FIG. 15, the operator inputs the gap D2, which is determined by the construction of the CZ furnace, into the control unit (S30). The measuring means scans a laser beam towards the outer periphery of the crucible, and detects the position of the end of the heat shield 5 on the basis of the large difference between the reflectance of a reflection beam upon striking the end of the heat shield 5 and the reflectance of the reflection beam from the melt surface 7 (S31), and determines a rotation angle θ2 corresponding to that position (S32). Next, the measuring means scans a laser beam towards the center of the crucible, and detects the position of the outer wall of the single crystal on the basis of the large difference between the reflectance of a reflection beam upon striking the outer wall of the pulled single crystal and the reflectance of the reflection beam from the melt surface 7 (S33), and determines a rotation angle θ3 corresponding to that position (S34). Next, the measuring means calculates the gap D on the basis of the schematic diagram of FIG. 12, the rotation angle θ2 and the rotation angle θ3 (S35), and automatically inputs the calculated gap D into the control unit (S36). The control unit calculates the gap D1 on the basis of the inputted gap D and the gap D2 inputted beforehand (S37), and compares the calculated gap D1 with the condition table of FIG. 6 stored beforehand (S38). Next, the control unit selects an optimal reflection method from among the three reflection methods (S39). Next, during pulling and growth of the single crystal, the control unit measures the melt level using the selected reflection method (S40). Steps 31 and 32 may be swapped with steps 33 and 34.

In the above process, the gap D can be measured by the measuring means provided in the CZ furnace. Also, an optimal reflection method can be selected by comparing the gap D1, determined on the basis of the measured gap D, with the condition table of FIG. 6. As a result, the melt level can be measured reliably and easily using an optimal reflection method.

In the above embodiments, the optimal reflection method is selected on the basis of the condition table of FIG. 6, by converting the gap D into the gap D1. Depending on the circumstances, a condition table may be created that replaces that of FIG. 6 using the gap D as a parameter. The optimal reflection method is selected then on the basis of that condition table.

The process involved in that case will not be described, since it should be obvious in the light of the process diagram of FIG. 15.

(Measuring Method Using the Measured Gap D and Gap L)

In a modification of Embodiment 3, an optimal reflection method is selected on the basis of two parameters, namely the gap D and gap L, measured by the measuring means provided in the CZ furnace.

Figure 16:
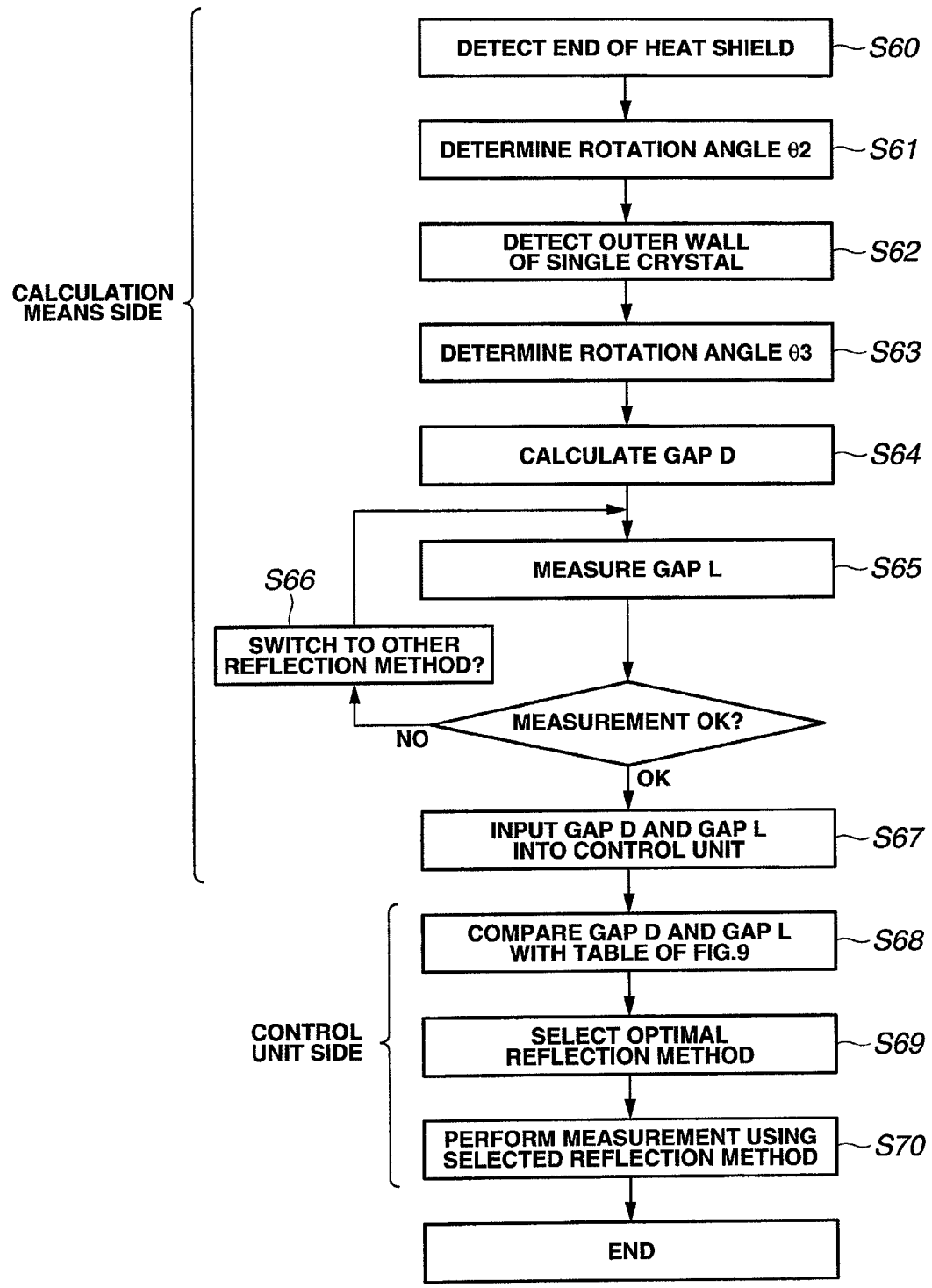
FIG. 16 is a process diagram of a modification of Embodiment 3.

FIG. 16 is a process diagram of a modification of Embodiment 3.

In FIG. 16, the measuring means scans a laser beam towards the outer periphery of the crucible, detects the position of the end of the heat shield 5 on the basis of the large difference between the reflectance of a reflection beam upon striking the end of the heat shield 5 and the reflectance of the reflection beam from the melt surface 7 (S60), and determines a rotation angle θ2 corresponding to that position (S61). Next, the measuring means scans a laser beam towards the center of the crucible, and detects the position of the outer wall of the single crystal on the basis of the large difference between the reflectance of a reflection beam upon striking the boundary between the melt surface and the pulled single crystal, and the reflectance of the reflection beam from the melt surface 7 (S62), and determines a rotation angle θ3 corresponding to that position (S63). Next, the measuring means calculates the gap D on the basis of the schematic diagram of FIG. 12, the rotation angle θ2 and the rotation angle θ3 (S64), and measures the gap L in accordance with any of the three reflection methods (S65). When measurement proves difficult with the reflection method used, one of the other methods is used instead (S66), and the gap L is measured again (S65). The measuring means automatically inputs the measured gap D and gap L into the control unit (S67). Next, the control unit compares the inputted gap D and gap L with the condition table of FIG. 9 stored beforehand (S68), and selects an optimal reflection method from among the three reflection methods (S69). The control unit measures the melt level using the selected reflection method during pulling and growth of the single crystal (S70).

The gap L is measured in the above process, but a gap L obtained beforehand may also be inputted into the control unit.

Figure 17:
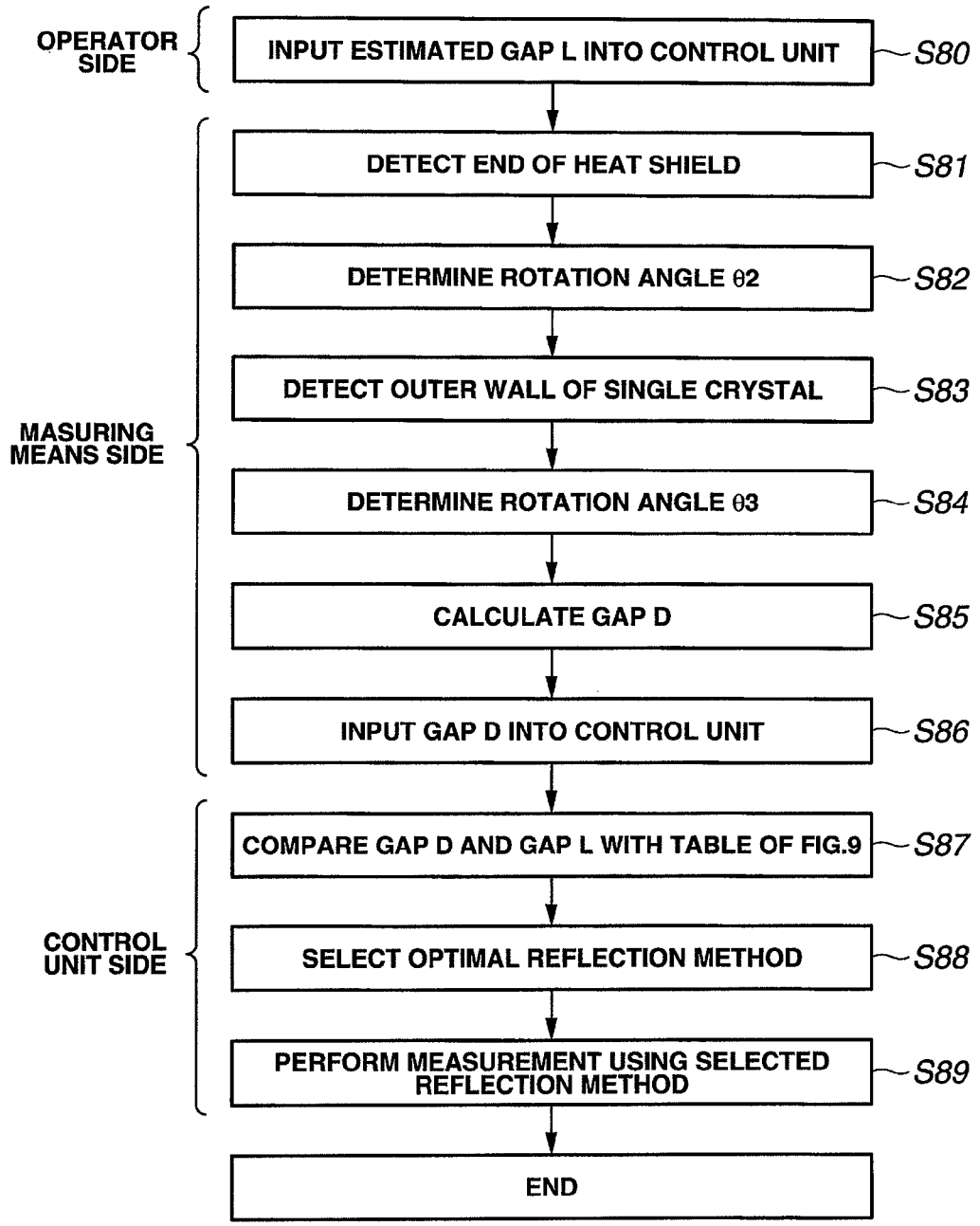
FIG. 17 is a process diagram of another modification of Embodiment 3.
Figure 18B:
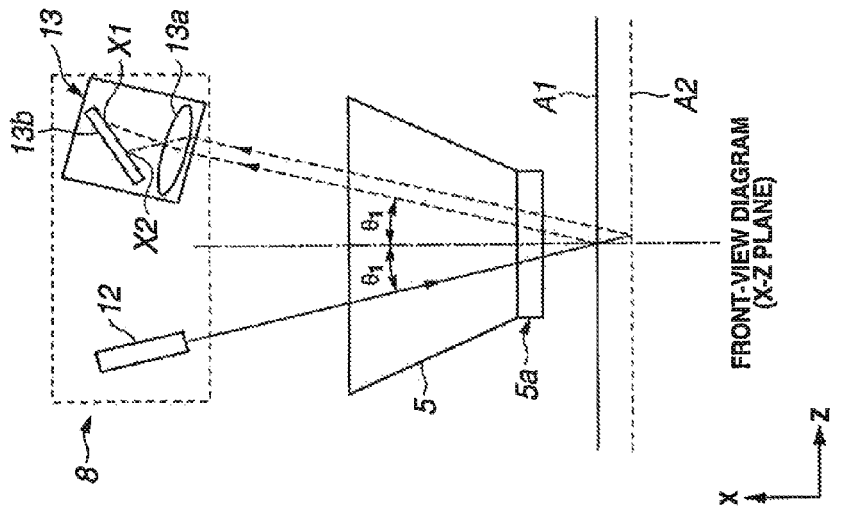
FIG. 18 is a diagram for explaining the trajectory of a laser beam in a direct reflection method.
Figure 18A:
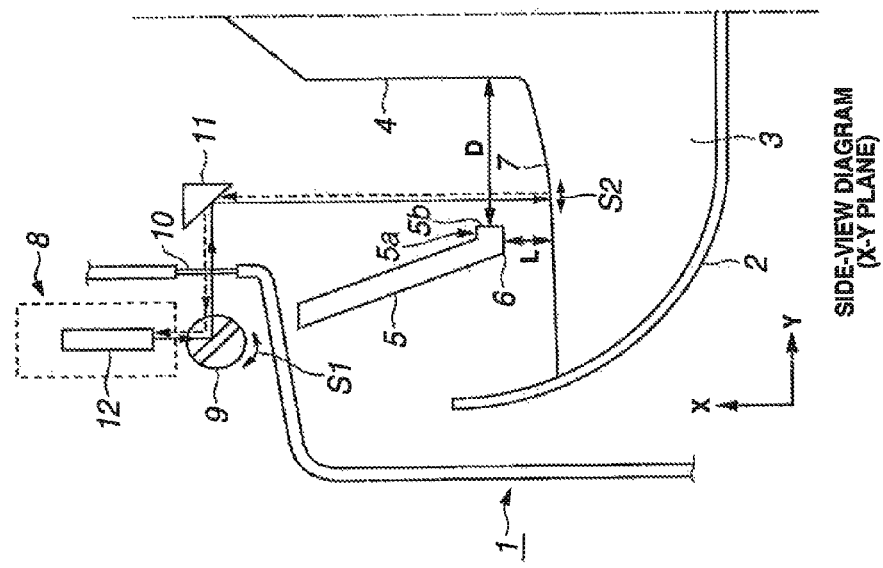
Figure 19A:
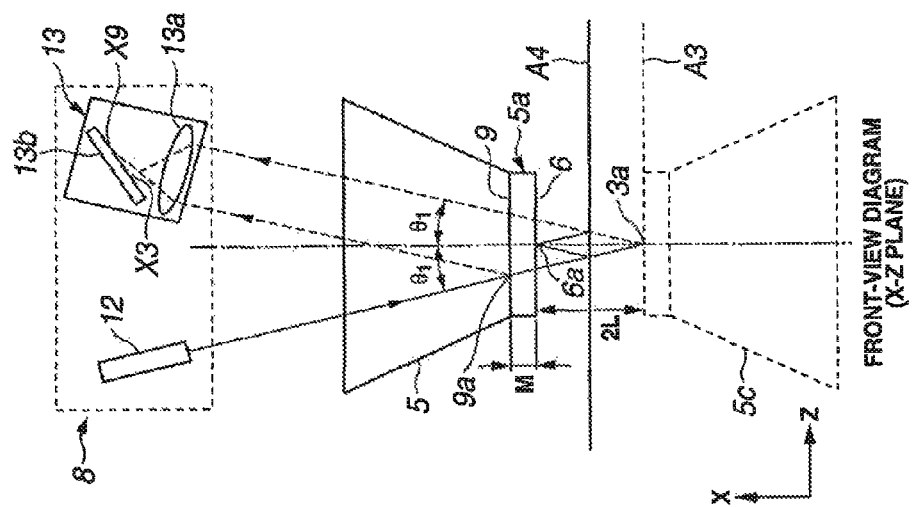
FIG. 19 is a diagram for explaining the trajectory of a laser beam in a return reflection method.
Figure 19B:
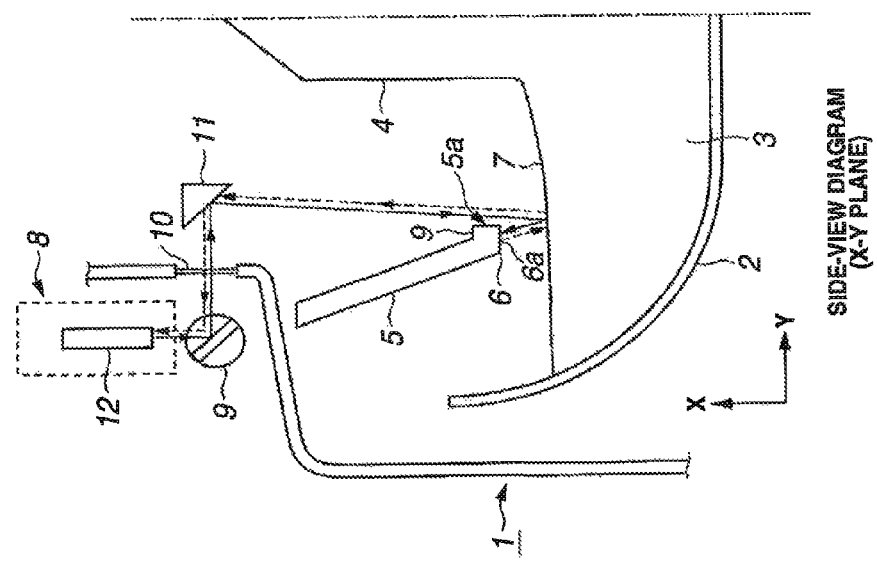
Figure 20:
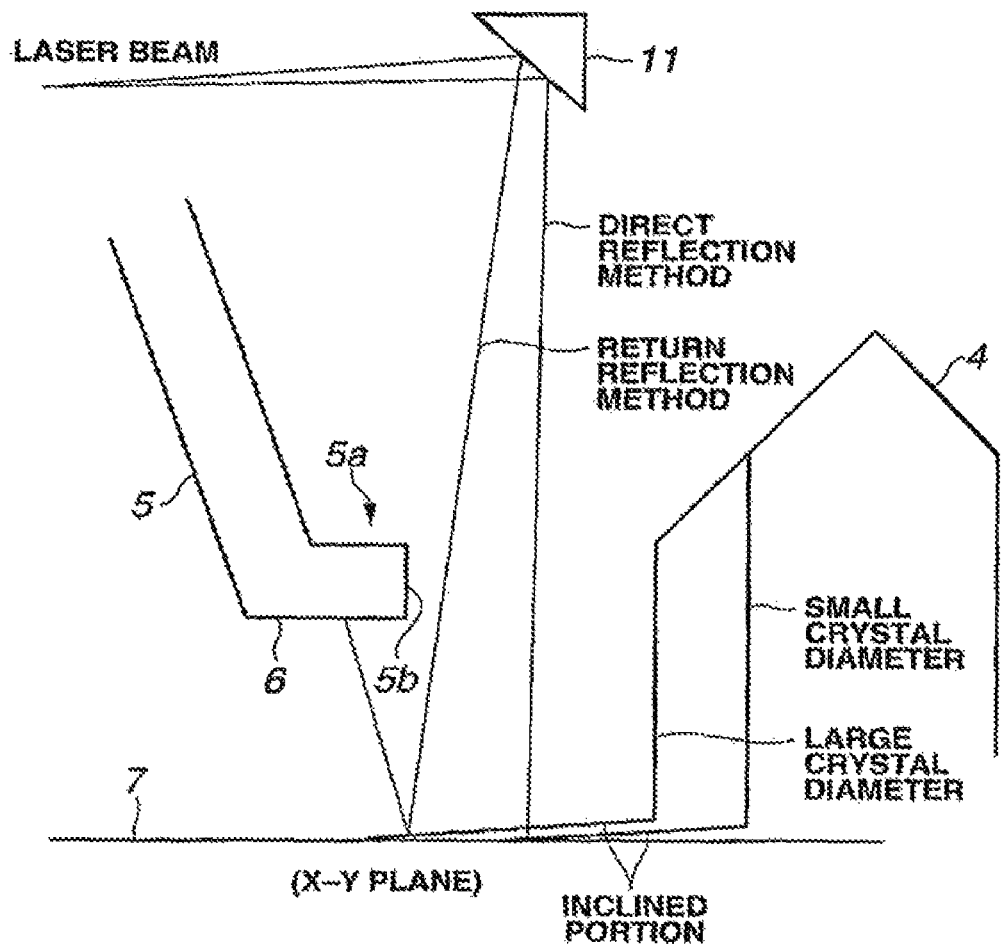
FIG. 20 is a diagram for explaining the influence of an inclined portion on the direct reflection method and the return reflection method.

FIG. 17 is a process diagram of another modification of Embodiment 3.

In FIG. 17, the operator inputs a gap L estimated beforehand into the control unit (S80). Then, the measuring means scans a laser beam towards the outer periphery of the crucible, and detects the position of the end of the heat shield 5, on the basis of the large difference between the reflectance of a reflection beam upon striking the end of the heat shield 5 and the reflectance of the reflection beam from the melt surface 7 (S81), and determines a rotation angle θ2 corresponding to that position (S82). Next, the measuring means scans a laser beam towards the center of the crucible, and detects the position of the outer wall of the single crystal on the basis of the large difference between the reflectance of a reflection beam upon striking the boundary between the melt surface and the pulled single crystal, and the reflectance of the reflection beam from the melt surface 7 (S83), and determines a rotation angle θ3 corresponding to that position (S84). The measuring means calculates the gap D on the basis of the schematic diagram of FIG. 12, the rotation angle θ2 and the rotation angle θ3 (S85), and automatically inputs the calculated gap D into the control unit (S86). The control unit compares the inputted gap D and the gap L inputted beforehand with the condition table of FIG. 9 (S87), and selects an optimal reflection method from among the three reflection paths (S88). The control unit measures the melt level using the selected reflection method during pulling and growth of the single crystal (S89).

The above process allows selecting an optimal reflection method on the basis of the gap L estimated beforehand and the gap D determined by the measuring means provided in the CZ furnace. As a result, the melt level can be measured reliably and easily using an optimal reflection method.

In the embodiment above, a red laser beam is used as a light source, but a violet, blue or green laser beam source may also be used in the invention of the present application instead of a red laser beam source.

The invention claimed is:

1. A method for measuring a liquid level in a single crystal pulling apparatus employing a CZ method, in which, in a CZ furnace provided with a heat shield surrounding a periphery of a single crystal to be pulled up out of a raw material melt held in a crucible and having a rim at a lower end thereof, a laser beam emitted by a laser beam source is projected onto a melt surface, the laser beam reflected on the melt surface is received, and the liquid level of the melt surface is measured based on the principle of triangulation, the method comprising:
setting a plurality of measuring methods having different ways of determining the liquid level;
acquiring, prior to manufacturing, information that associates any of the plurality of measuring methods to each gap from a predetermined position, set between an outer peripheral face of the single crystal and the heat shield, up to the outer peripheral face of the single crystal;
carrying out an actual measurement of the gap during the pulling and growth of the single crystal;
selecting a measuring method associated to the gap obtained by the actual measurement, on the basis of the information; and measuring the liquid level of the melt surface in use of a selected reflection method.

2. The method for measuring a liquid level in a single crystal pulling apparatus employing a CZ method according to claim 1, wherein the plurality of measuring methods include:

a measuring method of causing a laser beam emitted by the laser beam source to be reflected on the melt surface, and receiving thereafter the reflected laser beam;

a measuring method of causing a laser beam emitted by the laser beam source to be reflected first on the melt surface, causing then the reflected laser beam to be scattered and reflected on a lower face of the rim provided at the lower end of the heat shield, causing then the scattered and reflected laser beam to be reflected on the melt surface, and receiving thereafter the reflected laser beam; and a measuring method of causing a laser beam emitted by the laser beam source to be reflected first on the melt surface, causing then the reflected laser beam to be reflected on an inner peripheral face of the rim provided, at the lower end of the heat shield, and receiving thereafter the reflected laser beam, or causing a laser beam emitted by the laser beam source to be reflected first on the inner peripheral face of the rim provided at the lower end of the heat shield, causing then the reflected laser beam to be reflected on the melt surface, and receiving thereafter the reflected laser beam.

3. The method for measuring a liquid level in a single crystal pulling apparatus employing a CZ method according to claim 2, wherein in the information, the plurality of measuring methods are further associated with a strength of a magnetic field that is applied to the CZ furnace.

4. The method for measuring a liquid level in a single crystal pulling apparatus employing a CZ method according to claim 2, wherein, in the information, the plurality of measuring methods are further associated with a gap between a lower face of the heat shield and the melt surface.

* * * * *